(12) United States Patent
Li et al.

(10) Patent No.: US 11,469,322 B2
(45) Date of Patent: Oct. 11, 2022

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); TSMC China Company Limited, Shanghai (CN)

(72) Inventors: Lian-Jie Li, Shanghai (CN); Yan-Bin Lu, Shanghai (CN); Feng Han, Shanghai (CN); Shuai Zhang, Shanghai (CN)

(73) Assignees: TAIWAN SEMICONDUCTOR MANUFACTURING CO., LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 16/930,565

(22) Filed: Jul. 16, 2020

(65) Prior Publication Data

US 2021/0367074 A1 Nov. 25, 2021

(30) Foreign Application Priority Data

May 25, 2020 (CN) .......................... 202010447490.5

(51) Int. Cl.
*H01L 21/26* (2006.01)
*H01L 29/66* (2006.01)
(Continued)

(52) U.S. Cl.
CPC ........ *H01L 29/7835* (2013.01); *H01L 21/266* (2013.01); *H01L 21/26513* (2013.01);
(Continued)

(58) Field of Classification Search
CPC ......... H01L 21/26533; H01L 21/26586; H01L 21/266; H01L 29/7816; H01L 29/7835; H01L 29/0653; H01L 29/1095; H01L 29/6659; H01L 29/66681; H01L 21/26; H01L 21/265; H01L 21/26513; H01L 29/06; H01L 29/08; H01L 29/10;
(Continued)

(56) References Cited

U.S. PATENT DOCUMENTS

2003/0109112 A1* 6/2003 Wu ................... H01L 21/76202
438/400
2012/0220091 A1 8/2012 Challa et al.
(Continued)

FOREIGN PATENT DOCUMENTS

CN 103035731 * 4/2013

*Primary Examiner* — Fazli Erdem
(74) *Attorney, Agent, or Firm* — Birch, Stewart, Kolasch & Birch, LLP

(57) ABSTRACT

A semiconductor device includes a substrate, a gate structure, a drift region, a source region, a drain region, and a doped region. The gate structure is above the substrate. The drift region is in the substrate and under the gate structure. The source region and the drain region are on opposite sides of the gate structure. The drain region is in the drift region, and the source region is outside the drift region. The doped region is in the drift region and between the drain region and the gate structure. The doped region is spaced apart from a bottom surface of the drain region.

20 Claims, 24 Drawing Sheets

(51) Int. Cl.
*H01L 29/78* (2006.01)
*H01L 21/265* (2006.01)
*H01L 21/266* (2006.01)
*H01L 29/06* (2006.01)
*H01L 29/10* (2006.01)

(52) U.S. Cl.
CPC .... *H01L 21/26586* (2013.01); *H01L 29/0653* (2013.01); *H01L 29/1095* (2013.01); *H01L 29/6659* (2013.01); *H01L 29/66681* (2013.01); *H01L 29/7816* (2013.01)

(58) Field of Classification Search
CPC ... H01L 29/0847; H01L 29/66; H01L 29/665; H01L 29/66659; H01L 29/78
USPC .......................................................... 257/336
See application file for complete search history.

(56) References Cited

U.S. PATENT DOCUMENTS

| | | | |
|---|---|---|---|
| 2013/0069712 | A1 | 3/2013 | Trajkovic et al. |
| 2013/0341716 | A1* | 12/2013 | Sakamoto ......... H01L 29/66492 438/286 |
| 2014/0264573 | A1 | 9/2014 | Kocon et al. |
| 2015/0295081 | A1* | 10/2015 | Matsuda ............... H01L 29/063 257/339 |
| 2017/0194439 | A1* | 7/2017 | Wu .................... H01L 29/7835 |
| 2018/0190763 | A1* | 7/2018 | Yang .................. H01L 29/1095 |

* cited by examiner

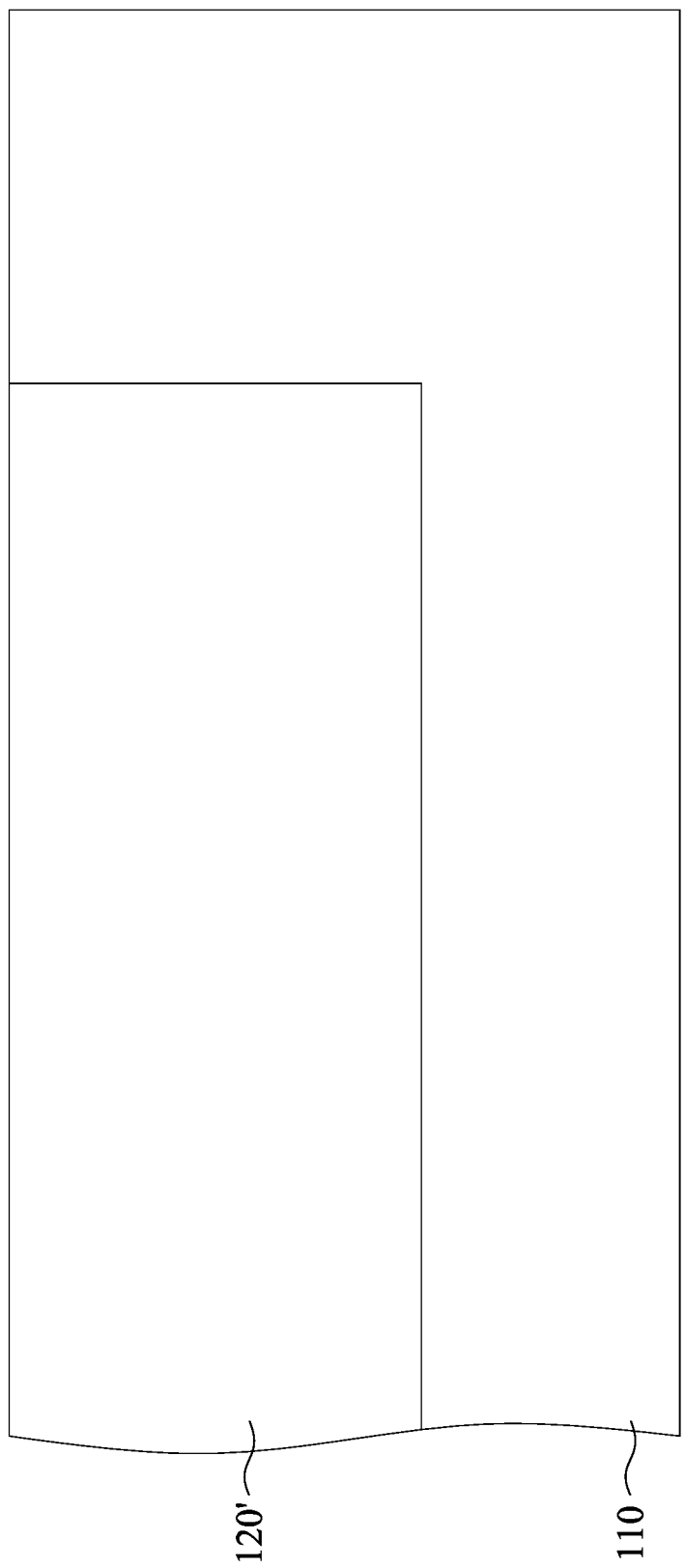

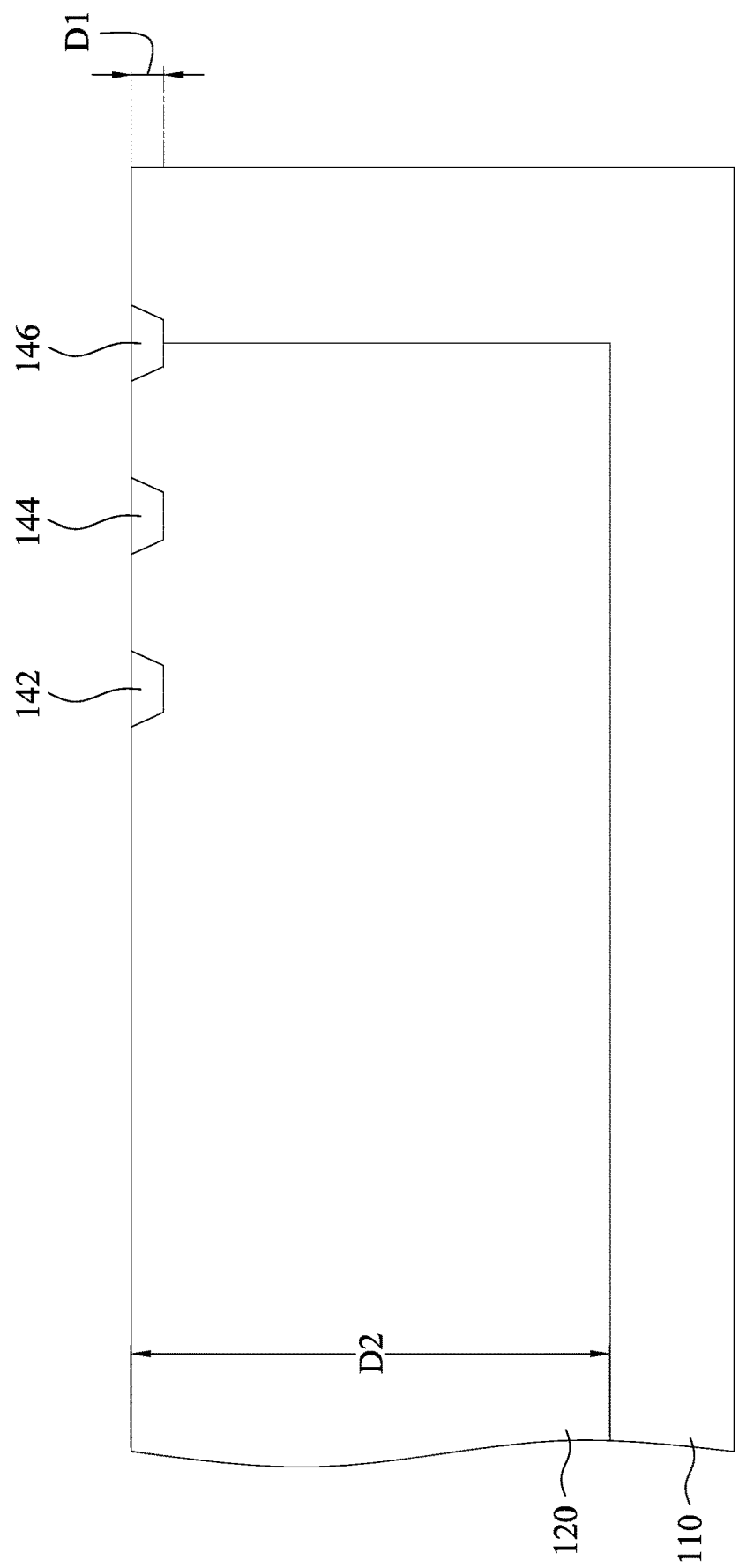

SEMICONDUCTOR DEVICE AND MANUFACTURING METHOD THEREOF

PRIORITY CLAIM AND CROSS-REFERENCE

The present application claims priority to China Application Serial Number 202010447490.5, filed May 25, 2020, which is herein incorporated by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are desired to maintain the electronic components' performance from one generation to the next. For example, low on-resistance and high breakdown voltage of transistors are desirable for various high power applications.

As semiconductor technologies evolve, metal oxide semiconductor field effect transistors (MOSFET) have been widely used in today's integrated circuits. MOSFETs are voltage controlled devices. When a control voltage is applied to the gate of a MOSFET and the control voltage is greater than the threshold of the MOSFET, a conductive channel is established between the drain and the source of the MOSFET. As a result, a current flows between the drain and the source of the MOSFET. On the other hand, when the control voltage is less than the threshold of the MOSFET, the MOSFET is turned off accordingly.

According to the polarity difference, MOSFETs may include two major categories. One is n-channel MOSFETs; the other is p-channel MOSFETs. On the other hand, according to the structure difference, MOSFETs can be further divided into three sub-categories, planar MOSFETs, lateral diffused MOS (LDMOS) FETs and vertical diffused MOSFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1C:
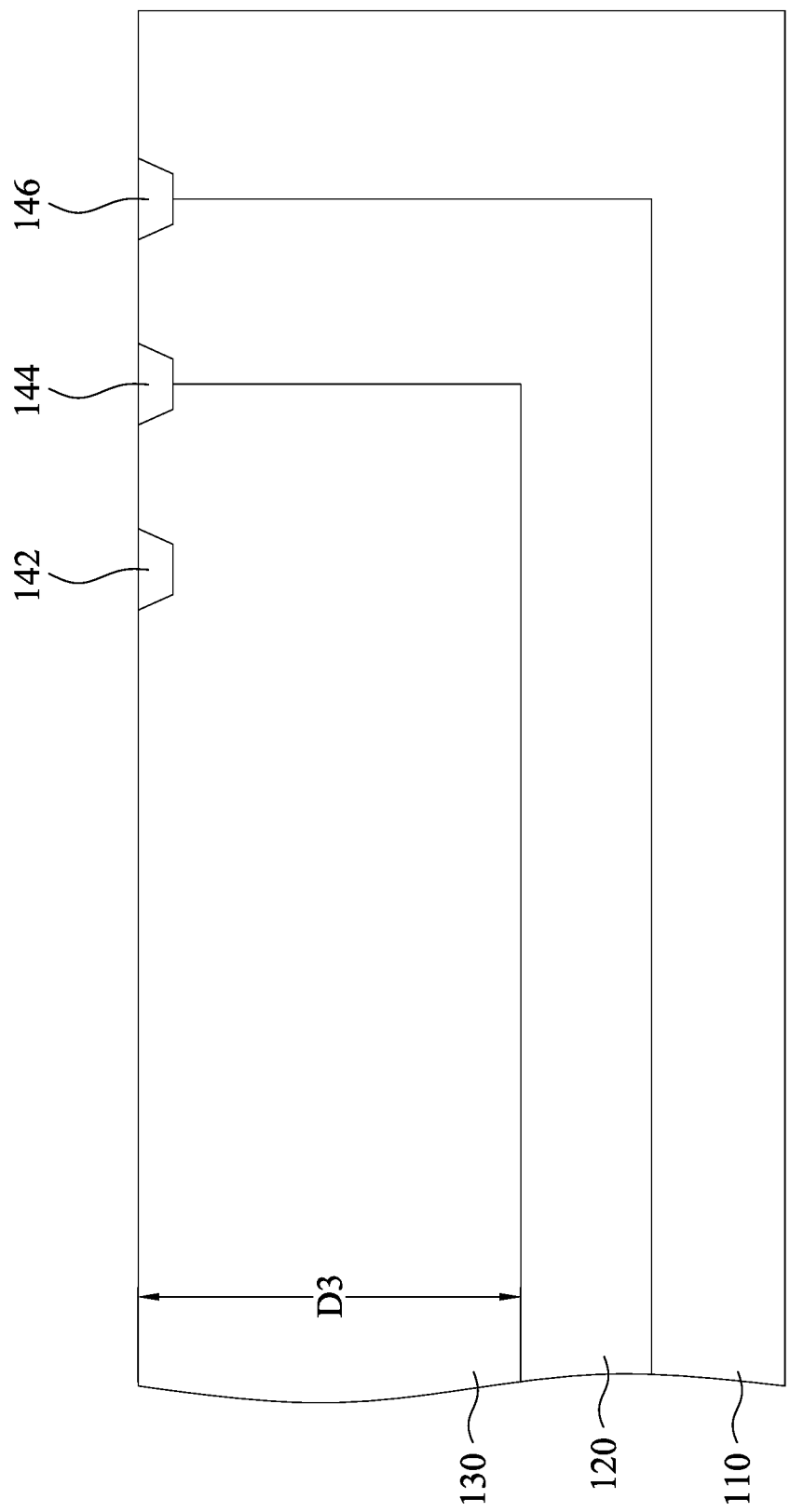
FIGS. 1A to 1O illustrate a method for manufacturing a semiconductor device in different stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the puRPse of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The lateral diffused (LD) MOS transistor has advantages. For example, the LDMOS transistor is capable of delivering more current per unit area because its asymmetric structure provides a short channel between the drain and the source of the LDMOS transistor. The present disclosure will be described with respect to embodiments in a specific context, a lateral diffused (LD) metal oxide semiconductor field effect transistor (MOSFET) having a doped region between the drain and the gate structure to improve Kirk effect. The embodiments of the disclosure may also be applied, however, to a variety of metal oxide semiconductor transistors. Hereinafter, various embodiments will be explained in detail with reference to the accompanying drawings.

Figure 1D:
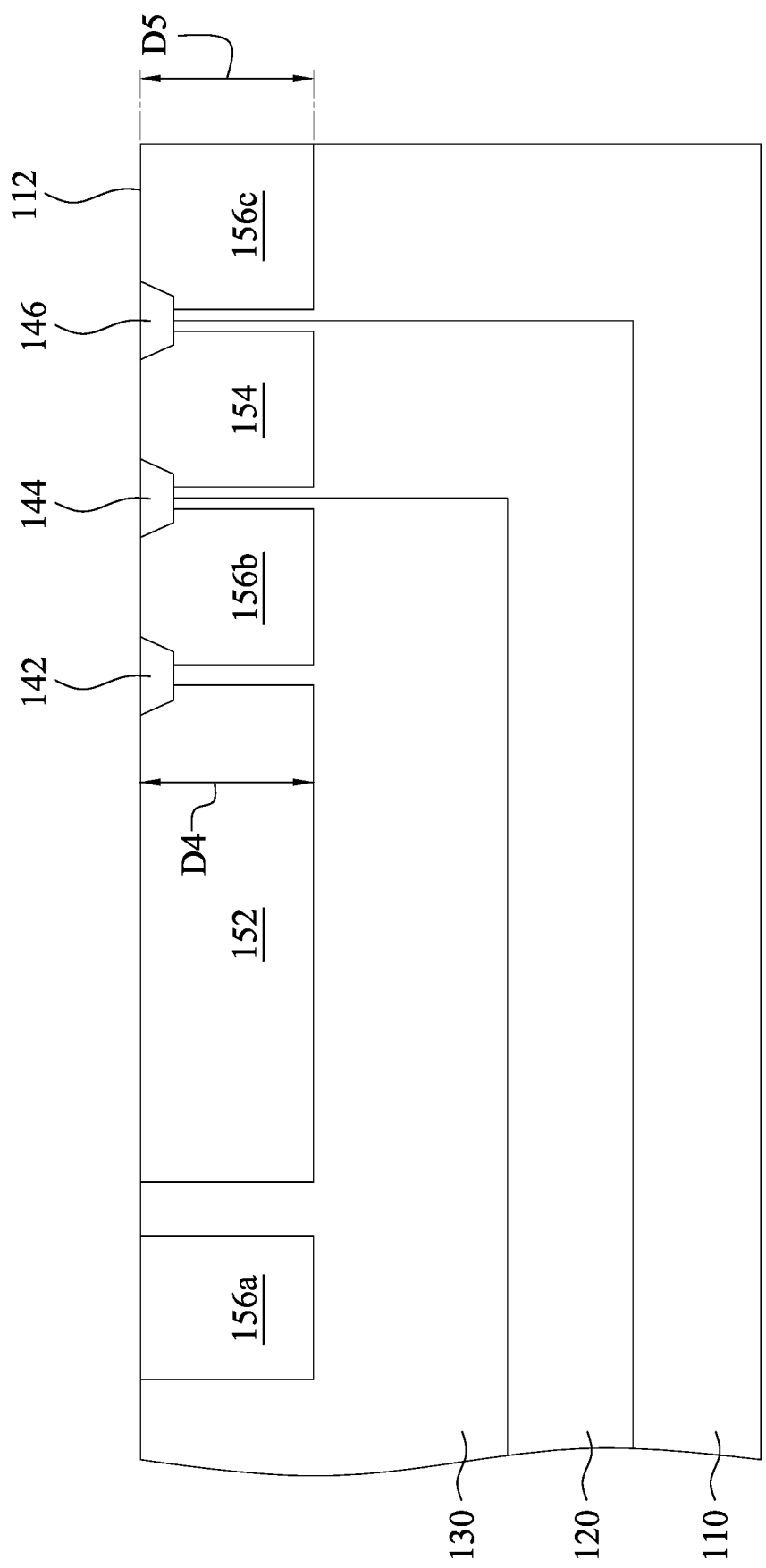
Figure 1E:
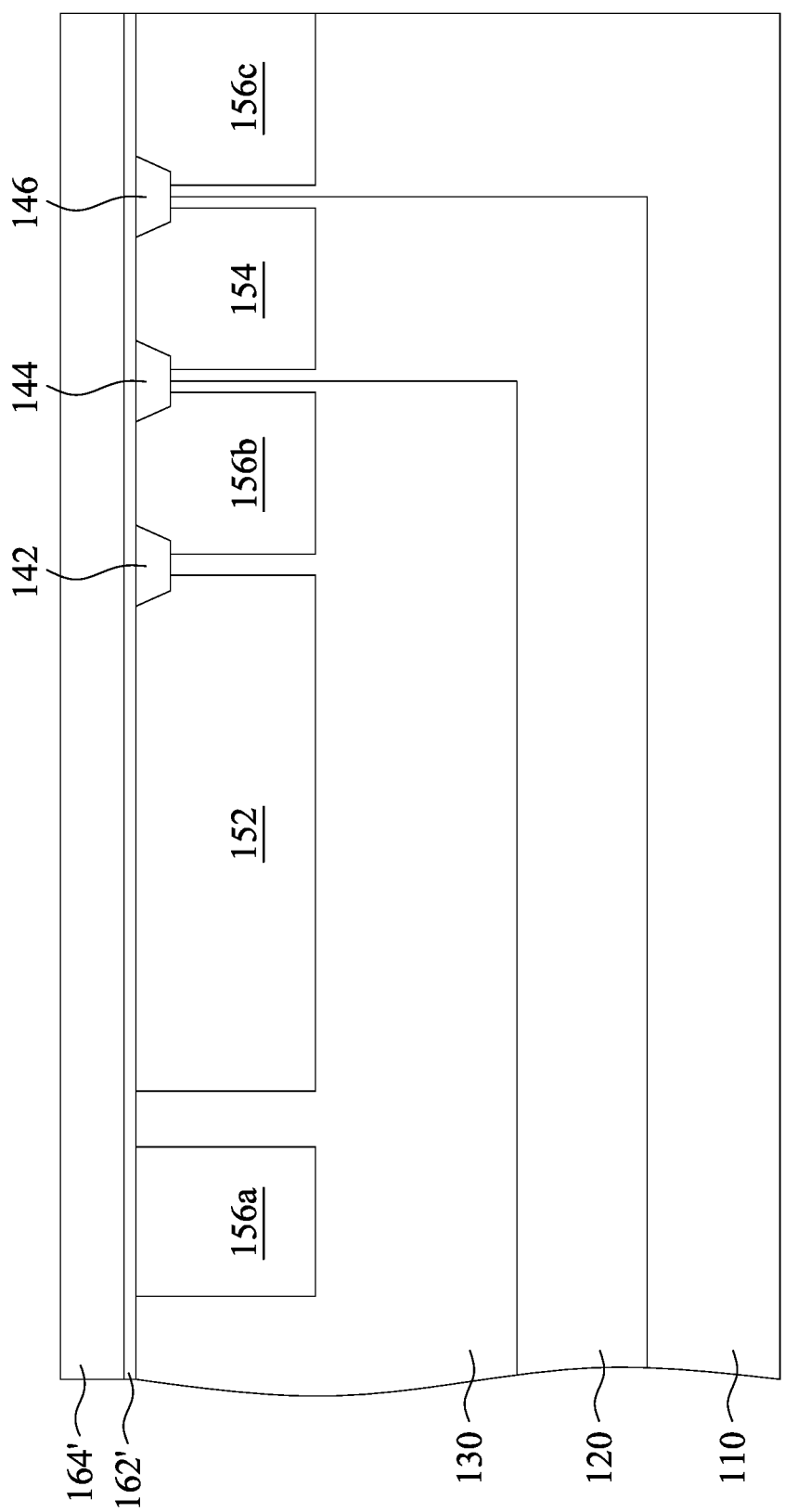
Figure 1F:
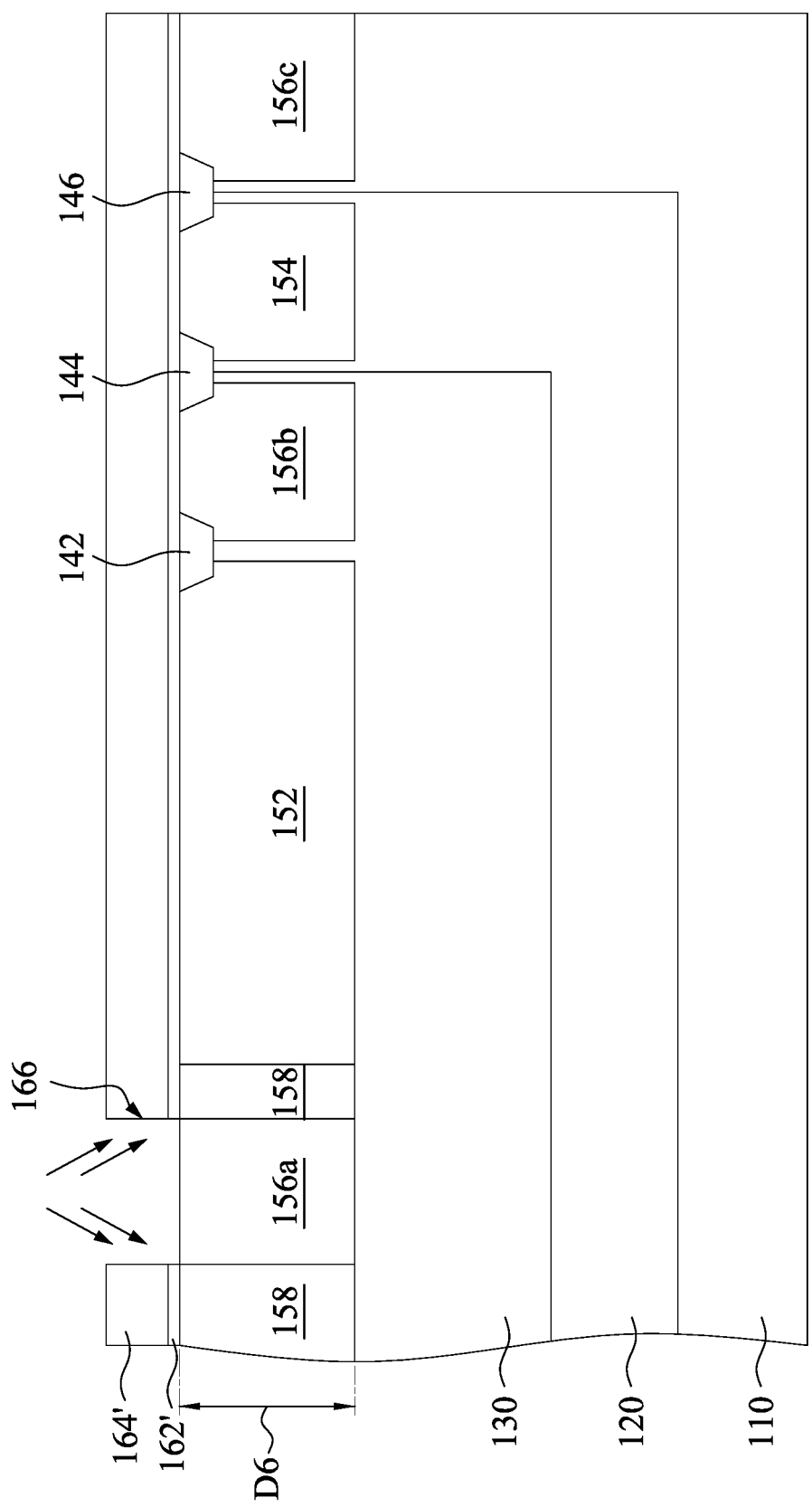
Figure 1G:
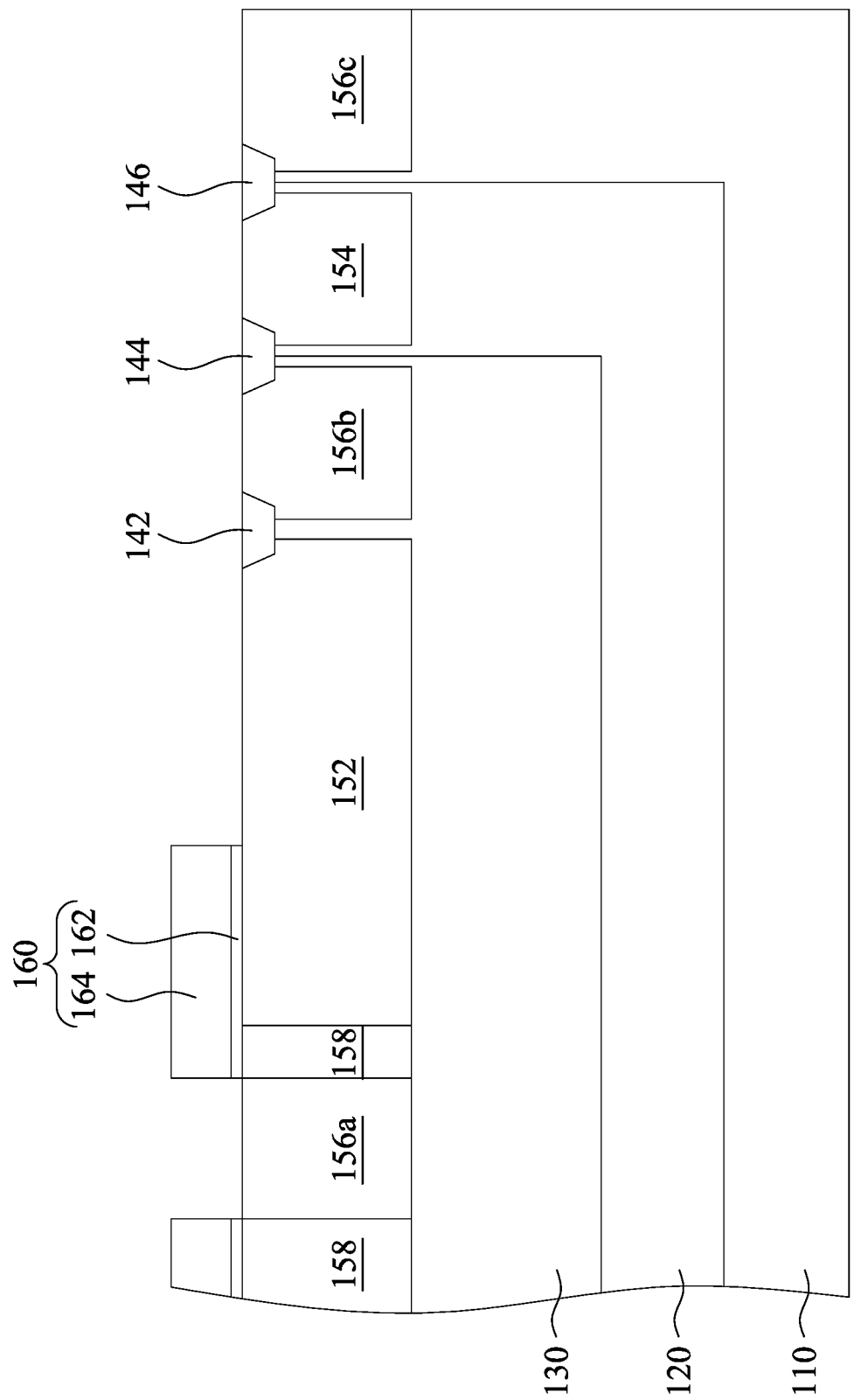
Figure 1H:
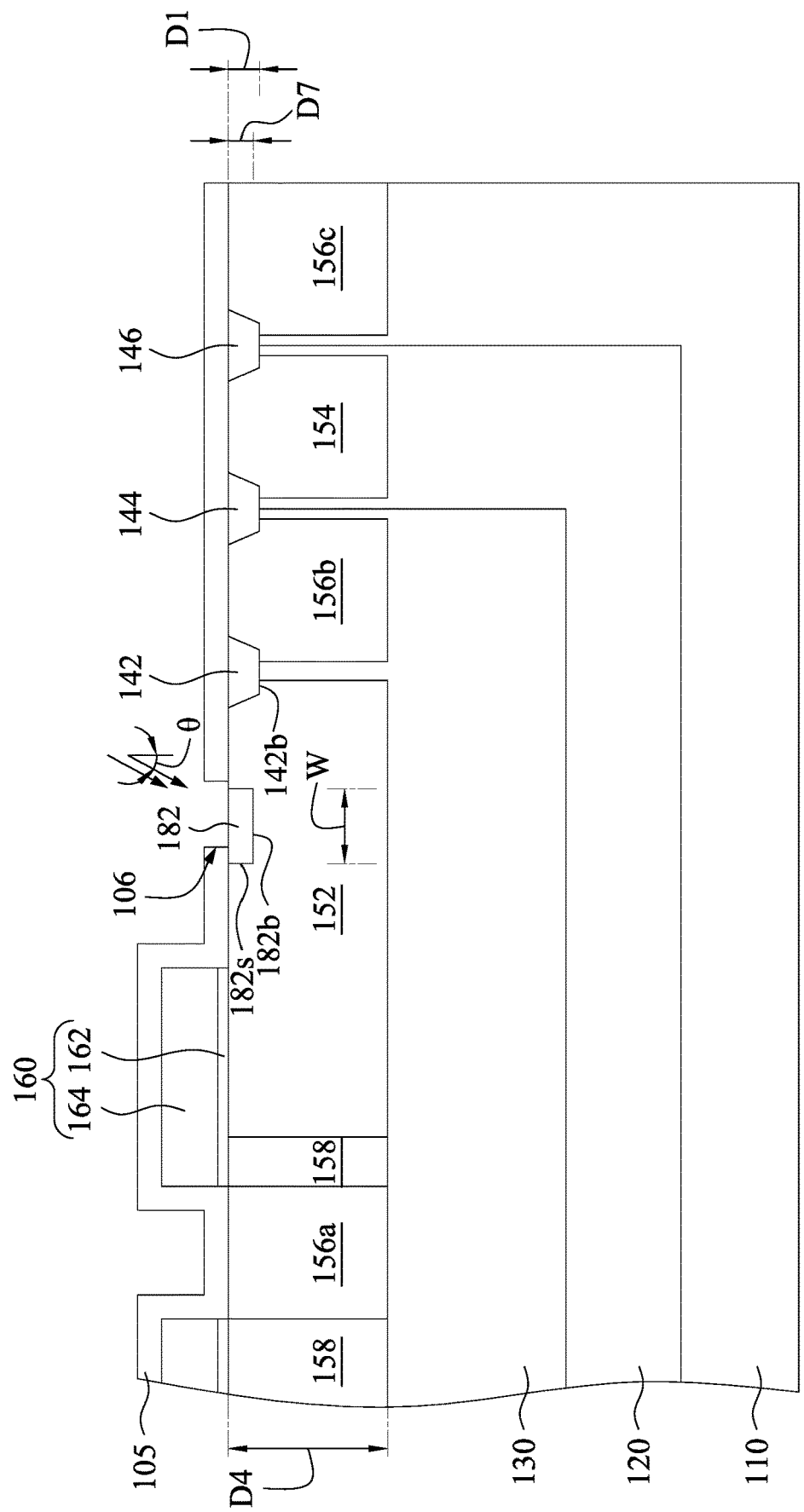
Figure 1I:
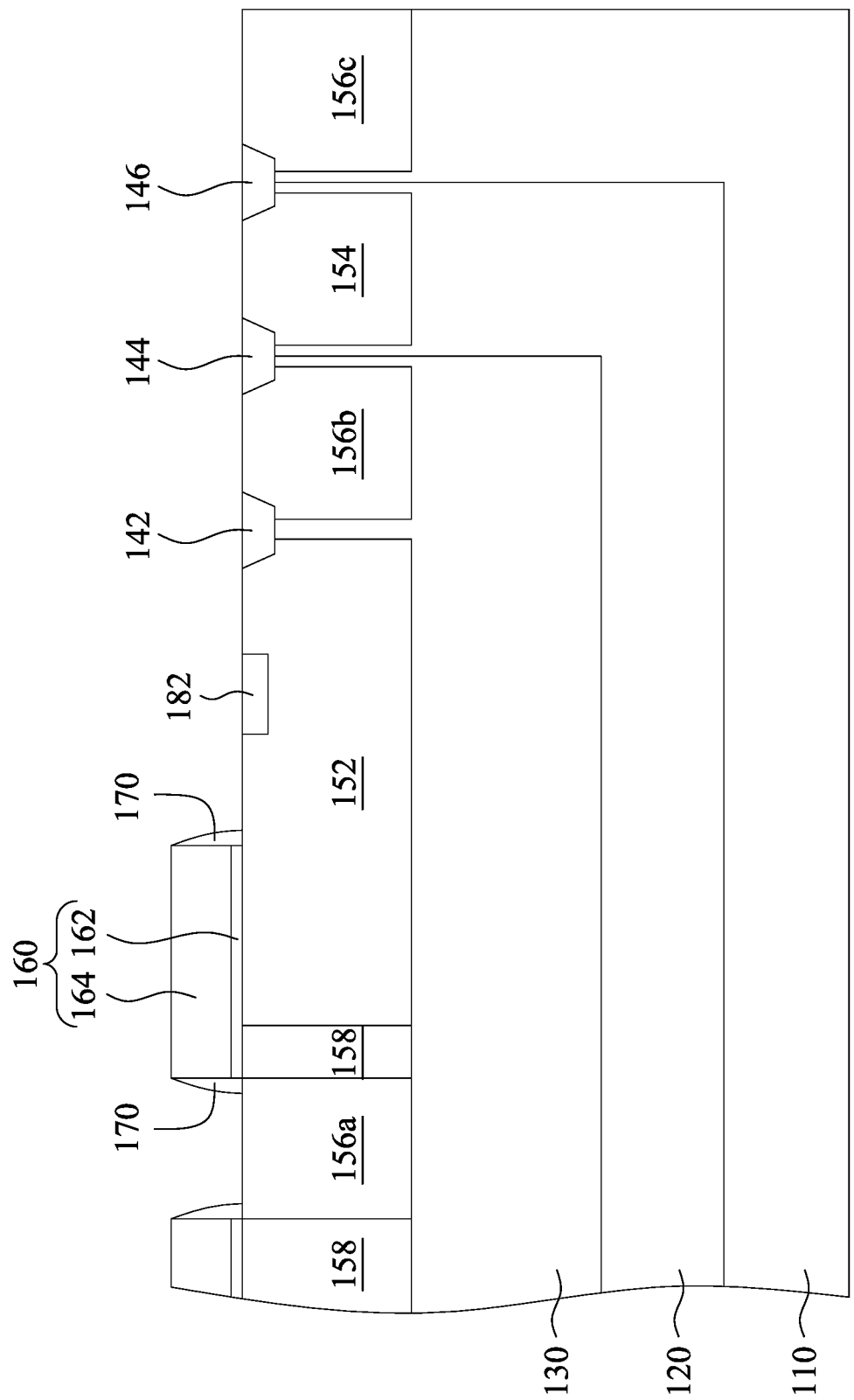
Figure 1J:
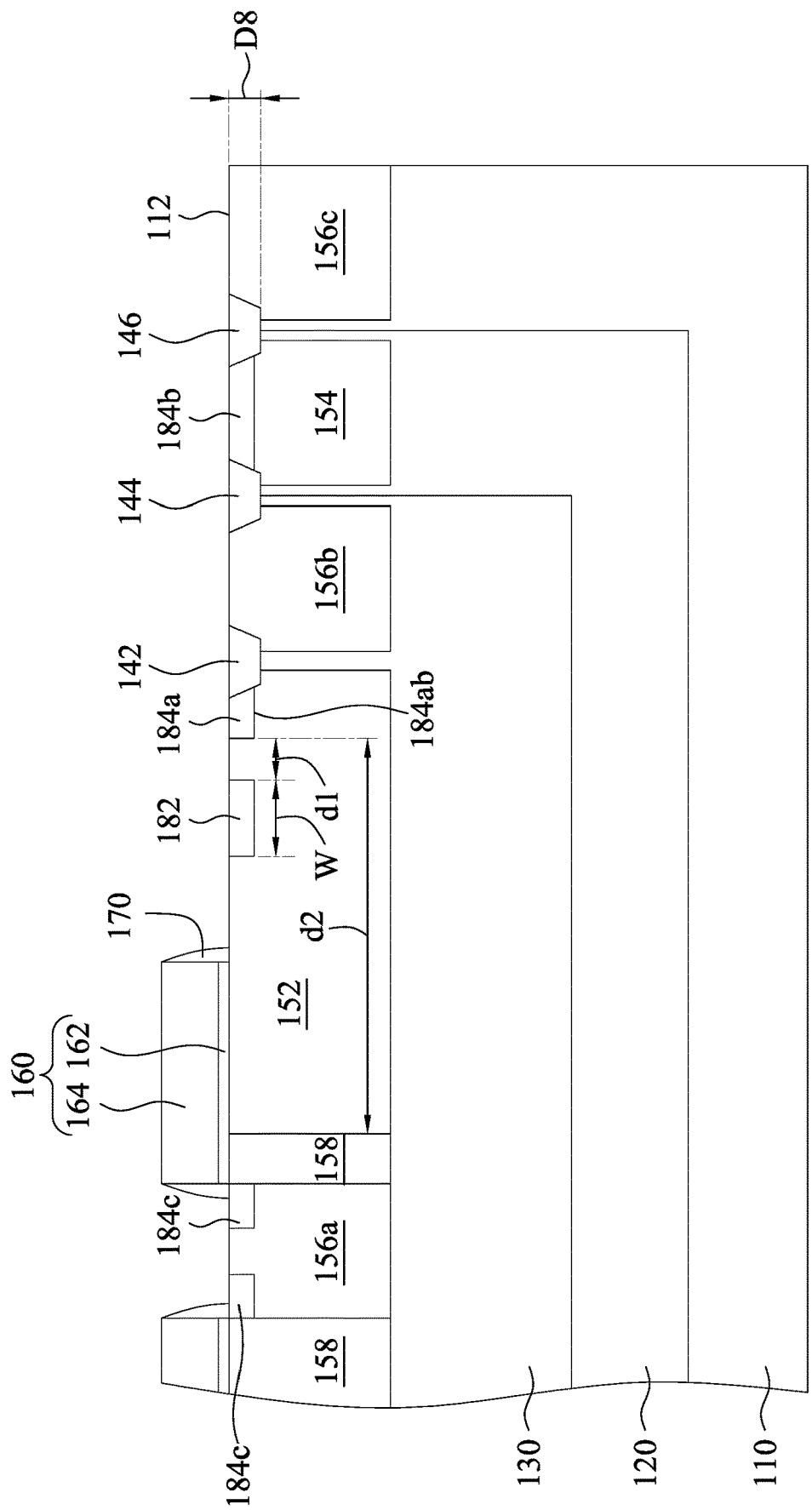
Figure 1K:
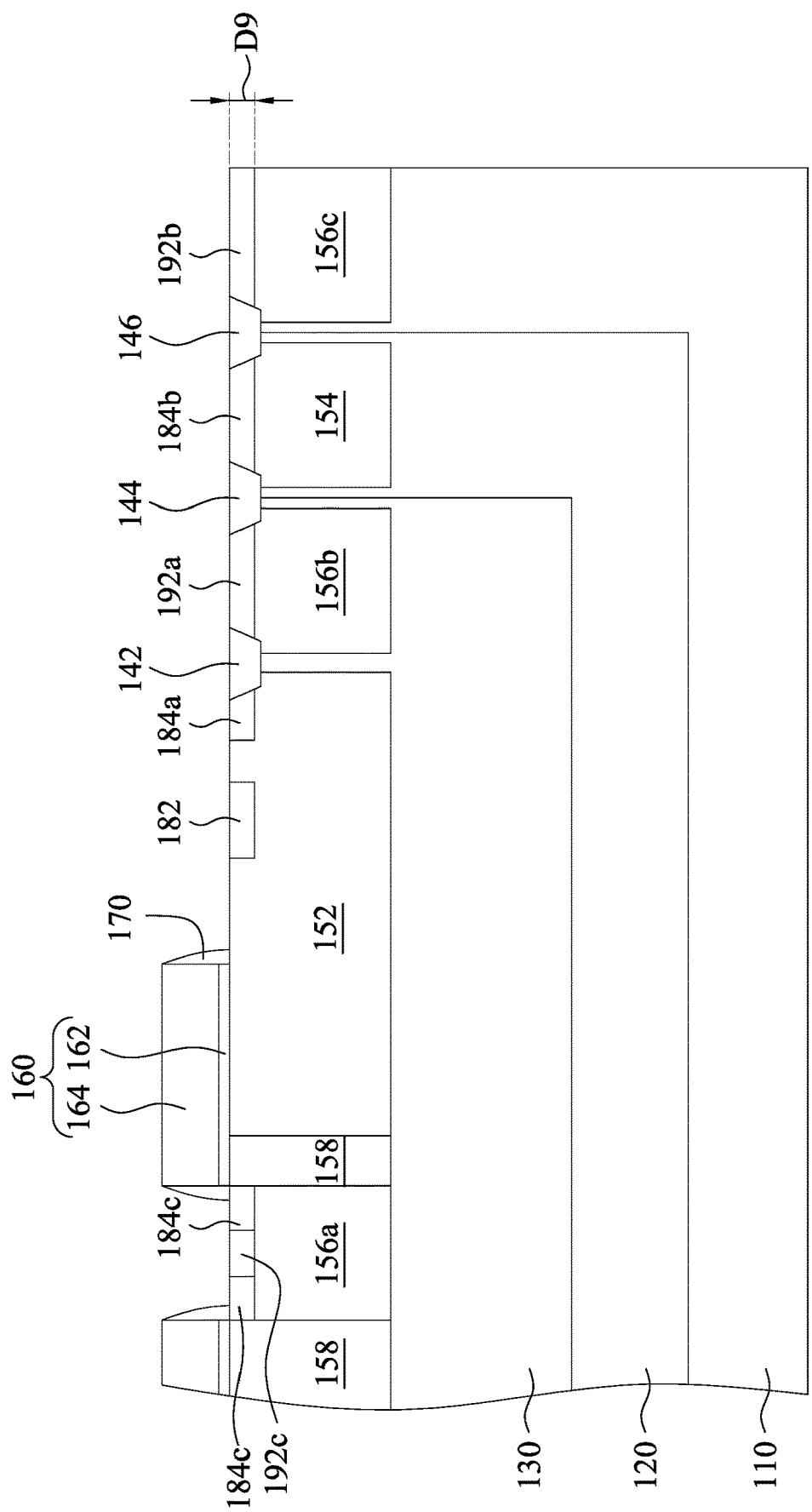
Figure 1L:
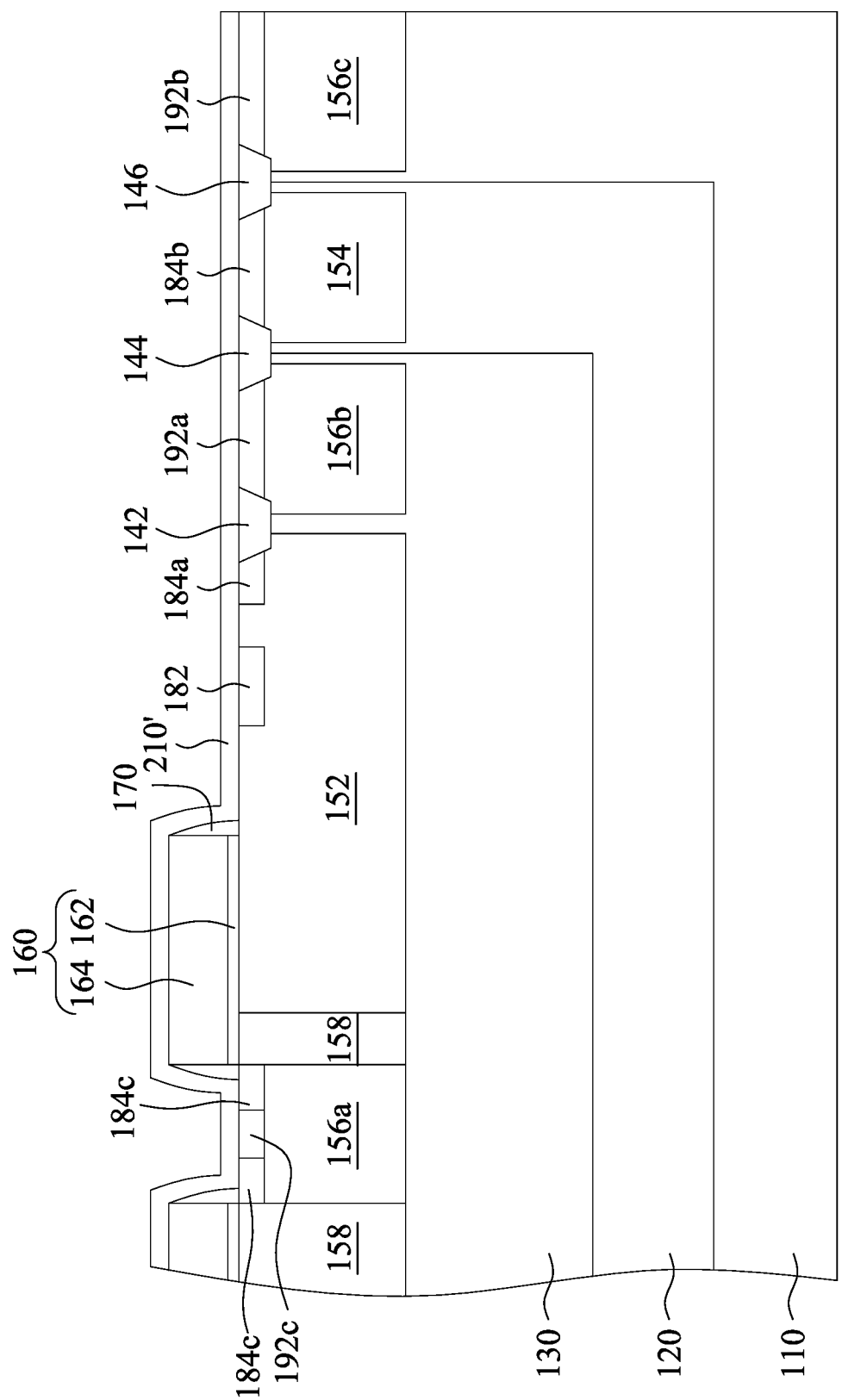
Figure 1M:
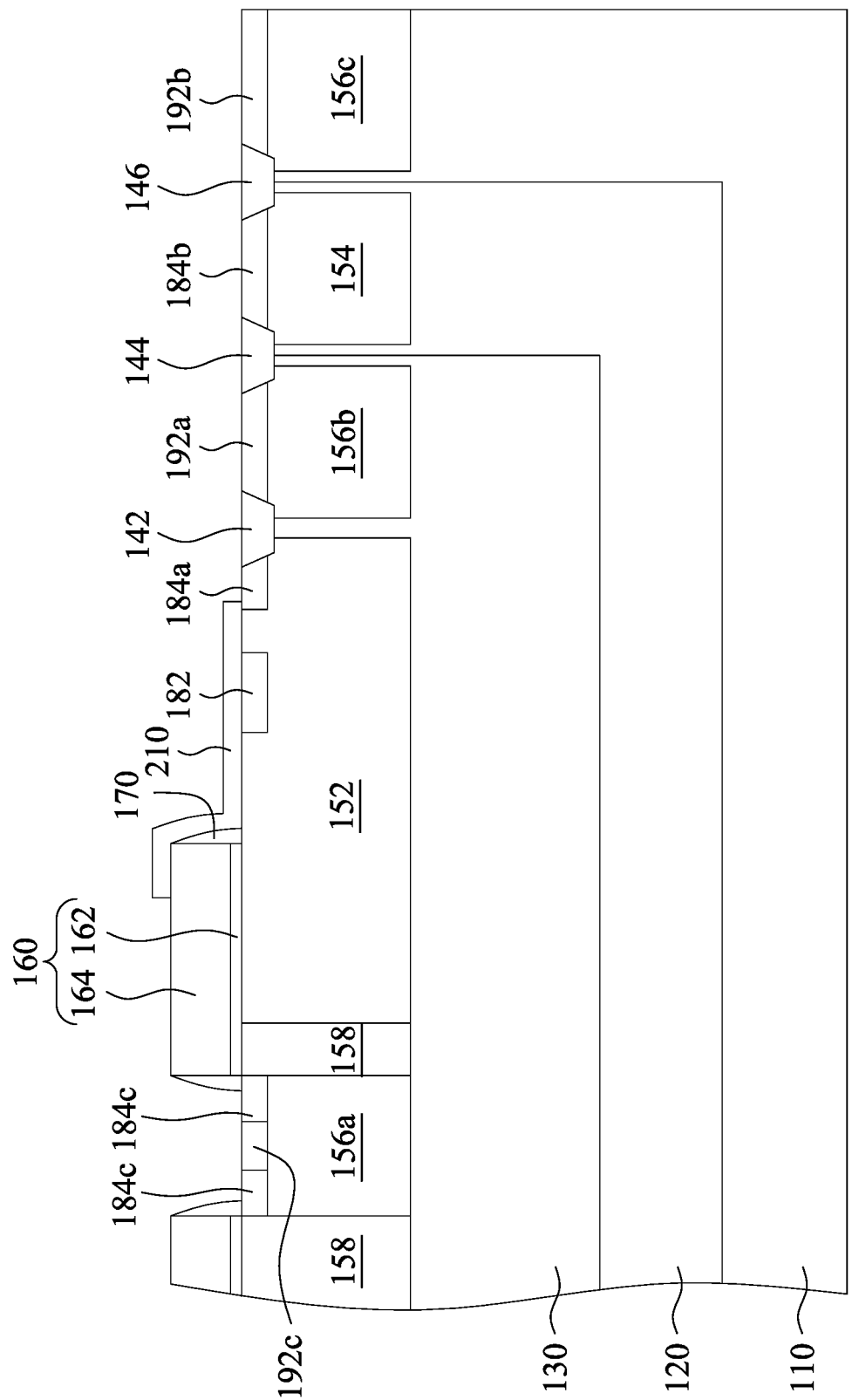
Figure 1N:
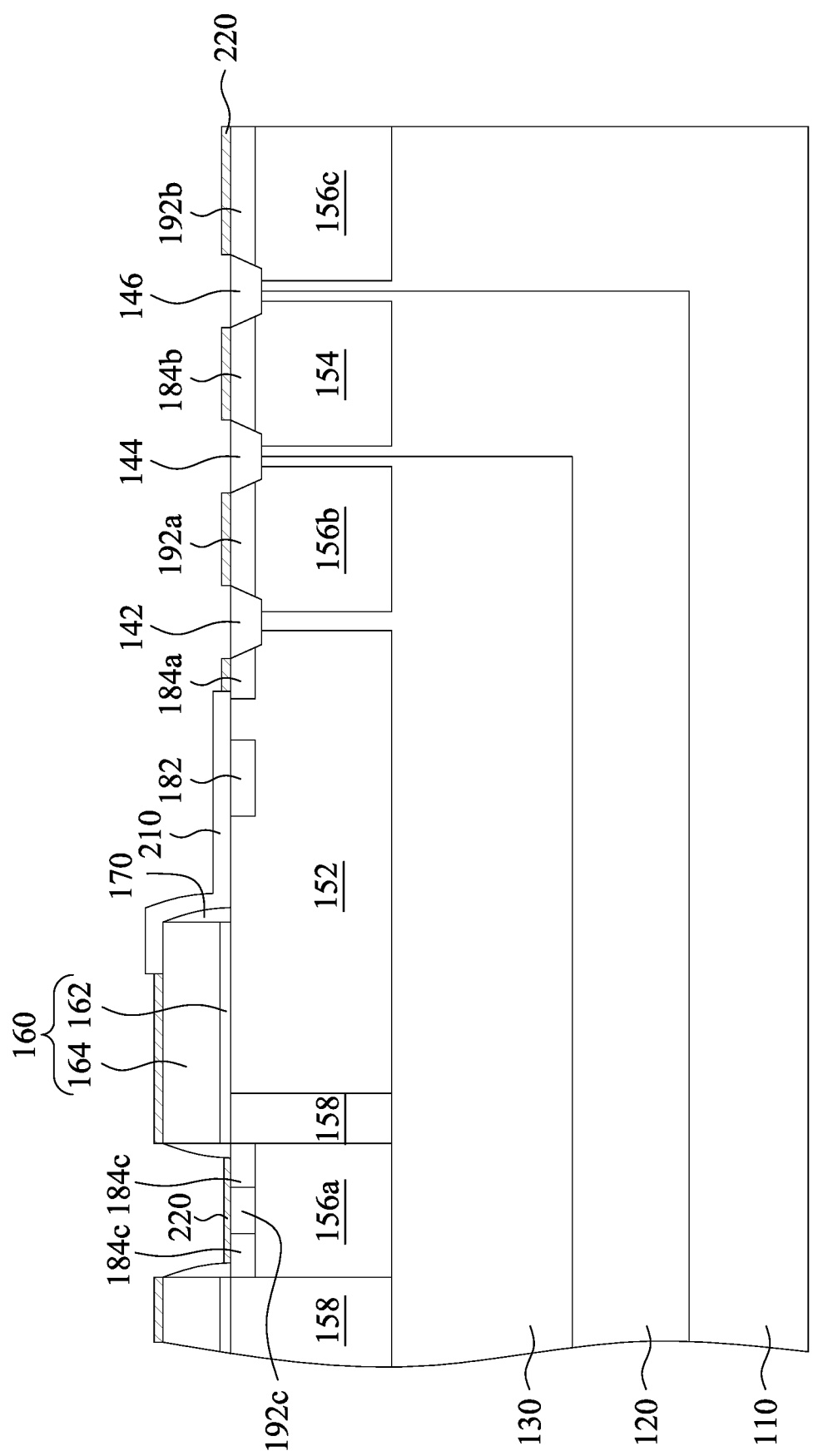
Figure 1O:
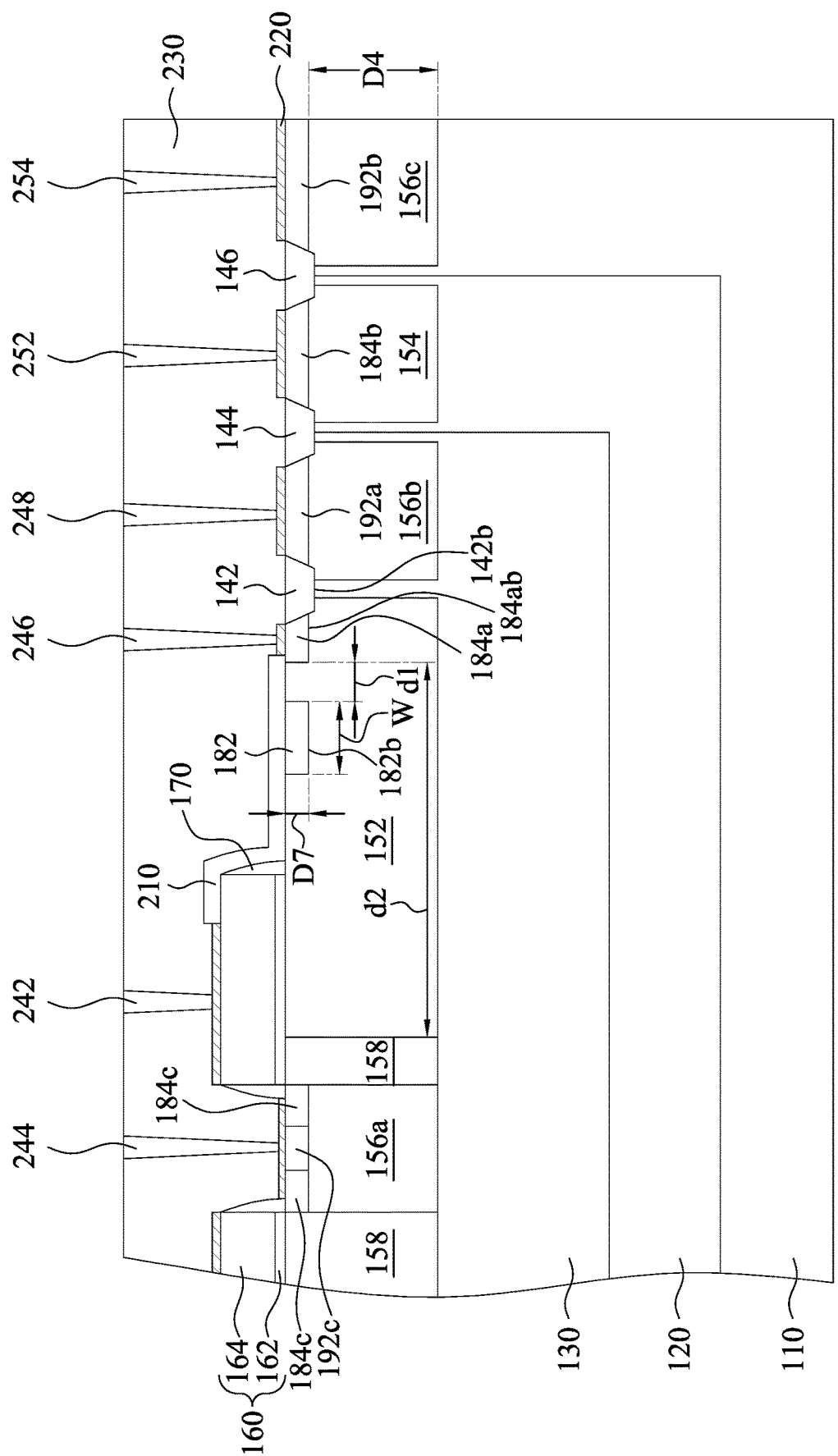

FIGS. 1A to 1O illustrate a method for manufacturing a semiconductor device in different stages in accordance with some embodiments. It is noted that FIGS. 1A to 1O have been simplified for a better understanding of the disclosed embodiment. Moreover, the semiconductor device may be configured as a system-on-chip (SoC) device having various PMOS and NMOS transistors that are fabricated to operate at different voltage levels. The PMOS and NMOS transistors may provide low voltage functionality including logic/memory devices and input/output devices, and high voltage functionality including power management devices. For example, transistors that provide low voltage functionality may have operating (or drain) voltages of 1.1 V with standard CMOS technology, or voltages of 1.8/2.5/3.3 V with special (input/output) transistors in standard CMOS technology. In addition, transistors that provide medium/high voltage functionality may have operating (or drain) voltages of 5 V or greater (e.g., 20-35 V). It is understood that the semiconductor device in FIGS. 1A to 1O may also include resistors, capacitors, inductors, diodes, and other suitable microelectronic devices that may be implemented in integrated circuits.

Referring to FIG. 1A, a semiconductor substrate 110 is provided. The semiconductor substrate 110 may include a semiconductor wafer such as a silicon wafer. Alternatively, the semiconductor substrate 110 may include other elementary semiconductors such as germanium. The semiconductor substrate 110 may also include a compound semiconductor such as silicon carbide, gallium arsenic, indium arsenide, and indium phosphide. Moreover, the semiconductor substrate 110 may include an alloy semiconductor such as silicon germanium, silicon germanium carbide, gallium arsenic phosphide, and gallium indium phosphide. In some embodiments, the semiconductor substrate 110 includes an epitaxial layer (epi layer) overlying a bulk semiconductor. Furthermore, the semiconductor substrate 110 may include a semiconductor-on-insulator (SOI) structure. For example, the semiconductor substrate 110 may include a buried oxide (BOX) layer formed by a process such as separation by implanted oxygen (SIMOX). In various embodiments, the semiconductor substrate 110 may include a buried layer such as an n-type buried layer (NBL), a p-type buried layer (PBL), and/or a buried dielectric layer including a buried oxide (BOX) layer. In the some embodiments, illustrated as an n-type MOS, the semiconductor substrate 110 includes a p-type silicon substrate (p-substrate). For example, p-type dopants are introduced into the semiconductor substrate 110 to form the p-substrate. To form a complementary MOS, an n-type buried layer, i.e., deep n-well (DNW), may be implanted deeply under the active region of the p-type MOS of the p-substrate 110 as described below.

Specifically, a deep n-type well (DNW) 120' is formed in the semiconductor substrate 110. In some embodiments, the DNW 120' is formed by ion implantation. In some embodiments, arsenic or phosphorus ions are implanted to form the DNW 120'. In some other embodiments, the DNW 120' is formed by selective diffusion. The DNW 120' functions to electrically isolate the p-substrate.

Reference is made to FIG. 1B. Isolation structures 142, 144, and 146 such as shallow trench isolations (STI) or local oxidation of silicon (LOCOS) (or field oxide, FOX) including isolation features may be formed in the semiconductor substrate 110 to define and electrically isolate various active regions so as to prevent leakage current from flowing between adjacent active regions. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In some other embodiments, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride. In some embodiments, the isolation structures 142, 144, and 146 have a depth D1 in a range of about 200 nm to about 400 nm.

In some embodiments, an annealing process may be performed during the formation of the isolation structures 142, 144, and 146, and the dopants in the DNW 120' (see FIG. 1A) are thus diffused in the annealing process, such that a depth of the DNW 120 is increased. In some embodiments, the DNW 120 has a depth D2 in a range of about 2 um to about 6 um, and the dopant concentration of the DNW 120 is between about 1015 and about 1017 per cubic centimeter. The isolation structures 142 and 144 are formed in the DNW 120. The isolation structure 146 is at the interface of the DNW 120 and the p-substrate 110.

Reference is made to FIG. 1C. In some embodiments, a deep p-type well (DPW) 130 is formed in the DNW 120. In some embodiments, the DPW 130 is formed by ion implantation. In some other embodiments, boron ions and/or boron difluoride ($BF_2$) ions are implanted to form the DPW 130. In some other embodiments, the DPW 130 is formed by selective diffusion. The isolation structure 142 is thus deposited in the DPW 130. The DPW 130 functions to electrically isolate the p-substrate. In some embodiments, the DPW 130 has a depth D3 in a range of about 2 um to about 3 um, and the dopant concentration of the DPW 130 is between about $10^{15}$ and about $10^{17}$ per cubic centimeter. In some embodiments, the DPW 130 and the DNW 120 have substantially the same or similar dopant concentrations.

Reference is made to FIG. 1D. An n-type doped region (NDD) (or n-type drift region) 152 is formed in the semiconductor substrate 110 and near the top surface 112 of the semiconductor substrate 110. Specifically, the NDD 152 is formed in the DPW 130 and adjacent the isolation structure 142. In FIG. 1D, a bottom portion of the NDD 152 is enclosed by the DPW 130. In some embodiments, the NDD 152 is formed by ion-implantation, diffusion techniques, or other suitable techniques. For example, an N-well mask is used to pattern a photoresist layer in a photolithography process or other suitable process. An exemplary photolithography process may include processing steps of photoresist coating, soft baking, mask aligning, exposing, post-exposure baking, developing, and hard baking. An ion implantation utilizing an n-type dopant, such as arsenic or phosphorus, may be performed to form the NDD 152 in the semiconductor substrate 110. In some embodiments, the dopant concentration of the NDD 152 is between about $10^{16}$ and about $10^{17}$ per cubic centimeter. The dopant concentration of the NDD 152 may be greater than the dopant concentration of the DPW 130 (or the DNW 120). In some embodiments, the NDD 152 has a depth D4 greater than the depth D1 (see FIG. 1B) of the isolation structures 142, 144, and/or 146. The depth D4 may be in a range of about 0.5 um to about 1 um.

Then, a shallow low-voltage n-type well (SHN) 154 is formed in the semiconductor substrate 110 and near the top surface 112 of the semiconductor substrate 110. Specifically, the SHN 154 is formed in the DNW 120 and between the isolation structures 144 and 146. In FIG. 1D, a bottom portion of the SHN 154 is enclosed by the DNW 120. In some embodiments, the SHN 154 is formed by ion-implantation, diffusion techniques, or other suitable techniques. For example, another N-well mask is used to pattern a photoresist layer in a photolithography process or other suitable process. An exemplary photolithography process may include processing steps of photoresist coating, soft baking, mask aligning, exposing, post-exposure baking, developing, and hard baking. An ion implantation utilizing an n-type dopant, such as arsenic or phosphorus, may be performed to form the SHN 154 in the semiconductor substrate 110. In some embodiments, the dopant concentration of the SHN 154 is between about $10^{17}$ and about $10^{18}$ per cubic centimeter. The dopant concentration of the SHN 154 may be greater than the dopant concentration of the NDD 152.

Subsequently, shallow low-voltage p-type wells (SHPs) 156a, 156b, and 156c are formed in the semiconductor substrate 110 and near the top surface 112 of the semiconductor substrate 110. Specifically, the SHPs 156a and 156b are formed in the DPW 130 and the SHP 156c is formed in the p-substrate 110. The SHPs 156a is configured to suppress the parasitic BJT action. The NDD 152 is formed between the SHPs 156a and 156b. The SHP 156b is formed between the isolation structures 142 and 144, and the SHP 156c is formed adjacent the isolation structure 146. In FIG. 1D, bottom portions of the SHPs 156a and 156b are enclosed by the DPW 130, and a bottom portion of the SHP 156c is enclosed by the p-substrate 110. In some embodiments, the SHPs 156a, 156b, and 156c are formed by ion-implantation, diffusion techniques, or other suitable techniques. For example, a P-well mask is used to pattern a photoresist layer in a photolithography process or other suitable process. An exemplary photolithography process may include processing steps of photoresist coating, soft baking, mask aligning, exposing, post-exposure baking, developing, and hard baking. An ion implantation utilizing a p-type dopant, such as boron and/or boron difluoride ($BF_2$), may be performed to form the SHPs 156a, 156b, and 156c in the semiconductor substrate 110. In some embodiments, the dopant concentration of each of the SHPs 156a, 156b, and 156c may be between about $10^{17}$ and about $10^{18}$ per cubic centimeter. The dopant concentration of each of the SHPs 156a, 156b, and 156c may be greater than the dopant concentration of the NDD 152.

In some embodiments, the SHN 154, and the SHPs 156a, 156b, and 156c have substantially the same or similar depth D5. In some embodiments, the depth D5 is greater than the depth D1 (see FIG. 1B) of the isolation structures 142, 144, and/or 146. The depth D5 may be in a range of about 1 um to about 2 um. Further, it is noted that the formation sequence of the NDD 152, the SHN 154, and the SHPs 156a, 156b, and 156c mentioned above is an example, and should not limit the present disclosure. In some other embodiments, the NDD 152 may be formed after the formation of the SHN 154 and/or the SHPs 156a, 156b, and 156c, and/or the SHN 154 may be formed after the formation of the SHPs 156a, 156b, and 156c.

Reference is made to FIG. 1E. A gate dielectric film 162' and a conductive film 164' are subsequently formed above the semiconductor substrate 110. The gate dielectric film 162' may include a silicon oxide layer. Alternatively, the gate dielectric film 162' may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric film 162' may have a multilayer structure such as one layer of silicon oxide and another layer of high k material. The gate dielectric film 162' may be formed using chemical vapor deposition (CVD), physical vapor deposition (PVD), atomic layer deposition (ALD), thermal oxide, other suitable processes, or combinations thereof.

The conductive film 164' may include a doped polycrystalline silicon (or polysilicon). Alternatively, the conductive film 164' may include a metal such as Al, Cu, W, Ti, Ta, TiN, TaN, NiSi, CoSi, other suitable conductive materials, or combinations thereof. The conductive film 164' may be formed by CVD, PVD, plating, and other proper processes. The conductive film 164' may have a multilayer structure and may be formed in a multi-step process using a combination of different processes.

Reference is made to FIG. 1F. An opening 166 is formed in the gate dielectric film 162' and the conductive film 164', and the opening 166 exposes the SHP 156a. The opening 166 may be formed by using a process including photolithography patterning and etching. An exemplary method for patterning the gate dielectric film 162' and the conductive film 164' is described below. A layer of photoresist is formed on the conductive film 164' by a suitable process, such as spin-on coating, and then patterned to form a patterned photoresist feature by a proper lithography patterning method. The pattern of the photoresist may then be transferred by a dry etching process to the underlying conductive film 164' and the gate dielectric film 162', in a plurality of processing operations and various proper sequences. The photoresist layer may be stripped thereafter. In still some other embodiments, a hard mask layer may be used and formed on the conductive film 164'. The patterned photoresist layer is formed on the hard mask layer. The pattern of the photoresist layer is transferred to the hard mask layer and then transferred to the conductive film 164'. The hard mask layer may include silicon nitride, silicon oxynitride, silicon carbide, and/or other suitable dielectric materials, and may be formed using a method such as CVD or PVD.

Then, high-voltage p-type implanted regions (HVPBs) 158 are formed in the DPW 130, such that each of the HVPBs 158 is formed between the SHP 156a and the NDD 152. That is, the NDD 152 is formed between the HVPB 158 and the isolation structure 142. The gate dielectric film 162' and the conductive film 164' act as implantation masks. The implantation in FIG. 1F may be tilted, with the tilt angle greater than the tilt angle of the SHP 156a, SHN 154, and LDD implantations, such that the HVPBs 158 are formed under the gate dielectric film 162' and the conductive film 164'. In some embodiments, the HVPBs 158 have a depth D6 in a range of about 1.5 um to about 2.5 um. In some embodiments, the dopant concentration of each of the HVPBs 158 may be between about $10^{17}$ and about $10^{18}$ per cubic centimeter. The dopant concentration of each of the HVPBs 158 may be greater than the dopant concentration of the SHPs 156a, 156b, and/or 156c.

Reference is made to FIG. 1G. The gate dielectric film 162' and the conductive film 164' in FIG. 1F are further patterned to form a gate structure 160 on the semiconductor substrate 110. In some embodiments, the gate structure 160 includes a gate dielectric layer 162 formed on the semiconductor substrate 110, and a gate electrode 164a formed on the gate dielectric layer 162. Further, the gate structure 160 overlies a portion of the NDD 152 and the HVPB 158. The gate electrode 164 may be configured to be coupled to metal interconnects and may be disposed overlying the gate dielectric layer 162. The gate dielectric layer 162 and the gate electrode 164 formed on the semiconductor substrate 110 are then patterned to form a plurality of gate structures 160 using a process including photolithography patterning and etching.

Reference is made to FIG. 1H. An N-type light doped region (NLDD) 182 is formed in the NDD 152. Specifically, the NLDD 182 is formed in the NDD 152 and spaced apart from the isolation structure 142. In FIG. 1H, a bottom portion of the NLDD 182 is enclosed by the NDD 152. A depth D7 of the NLDD 182 is less than the depth D4 of the NDD 152 and the depth D1 of the isolation structure 142, and the depth D7 is in a range of about 0.2 um to about 0.4 um. Stated in another way, a bottom surface 182b of the NLDD 182 is above a bottom surface 142b of the isolation structure 142.

In some embodiments, the NLDD 182 is formed by ion-implantation, diffusion techniques, or other suitable techniques. For example, another N-well mask 105 is deposited over the structure in FIG. 1G (i.e., over the NDD 152, the SHN 154, the SHPs 156a-156c, the gate structure 160, and the isolation structures 142, 144, and 146). The N-well mask 105 has an opening 106 exposing a portion of the NDD 152. An ion implantation utilizing an n-type dopant, such as arsenic or phosphorus, may be performed to form the NLDD 182 in the NDD 152. In some embodiments, the NLDD 182 implantation may be tilted or vertical, with the tilt angle θ between about 0 degree and about 45 degrees. The vertical implantation (i.e., the tilt angle θ is 0 degree) forms an NLDD 182 right under the opening 106, and the width W of the NLDD 182 is substantially the same as the width of the opening 106. In some other embodiments, the tilted implantation (i.e., the tilt angle θ is greater than 0 degree) form an NLDD 182 offset from the opening 106, and the width W of the NLDD 182 is greater than the width of the opening 106. With the tilted implantation, the size of the opening 106 may be reduced, such that the opening 106 won't expose a region that is supposed to form a drain region of the semiconductor device. Further, the tilt angle of the implantation can be tuned according to the desired width W and/or distance d1 (see FIG. 1J) between the NLDD 182 and the following formed drain region (i.e., the N-type source/drain region 184a in FIG. 1J).

In some embodiments, the dopant concentration of the NLDD 182 is between about $10^{17}$ and about $10^{19}$ per cubic centimeter. The dopant concentration of the NLDD 182 is greater than the dopant concentration of the NDD 152. In some embodiments, the width W of the NLDD 182 is greater than 0 um and equal to or less than about 1 um. The NLDD 182 improves the Kirk effect of the semiconductor device and further improves the drain drain current (Id)-voltage (Vd) tailing performance, and the detailed description will be discussed in the following paragraphs.

Reference is made to FIG. 1I. The N-well mask 105 in FIG. 1H is removed, and sidewall spacers 170 are formed on opposite sides of the gate structure 160. The sidewall spacers 170 may include a dielectric material such as silicon oxide. Alternatively, the sidewall spacers 170 may optionally include silicon oxide, silicon nitride, silicon oxynitride, SiCN, SiC$_x$O$_y$N$_z$, or combinations thereof. In some embodiments, the sidewall spacers 170 may have a multilayer structure. The sidewall spacers 170 can be formed using a deposition method, such as plasma enhanced chemical vapor deposition (PECVD), low-pressure chemical vapor deposition (LPCVD), sub-atmospheric chemical vapor deposition (SACVD), or the like. The formation of the sidewall spacers 170 may include blanket forming spacer layers and then performing etching operations to remove the horizontal portions of the spacer layers. The remaining vertical portions of the spacer layers form the sidewall spacers 170.

Reference is made to FIG. 1J. N-type source/drain region 184a, N-type pick-up region 184b, and N-type source/drain region 184c are formed in the N-wells or P-wells. The N-type source/drain regions 184a, 184c and N-type pick-up region 184b are N+ or heavily doped regions. In some embodiments, the N-type source/drain regions 184a, 184c and N-type pick-up region 184b include n-type dopants such as P or As. The N-type source/drain regions 184a, 184c and N-type pick-up region 184b may be formed by a method such as ion implantation or diffusion. A rapid thermal annealing (RTA) process may be used to activate the implanted dopant. In various embodiments, the N-type source/drain regions 184a, 184c and N-type pick-up region 184b may have different doping profiles formed by multi-process implantation.

The N-type source/drain region 184a is formed in the NDD 152 and adjacent the isolation structure 142, and the N-type source/drain region 184a is referred to as a drain region of the semiconductor device. Further, the N-type source/drain region 184a is formed between the NLDD 182 and the isolation structure 142. The N-type pick-up region 184b is formed in the SHN 154 and between the isolation structures 144 and 146, and the N-type source/drain regions 184c are formed in the SHP 156a (outside the NDD 152) and spaced apart from each other. The N-type source/drain region 184c is referred to as a source region of the semiconductor device, in some embodiments. A depth D8 of each of the N-type source/drain region 184a, 184c and N-type pick-up region 184b is less than the depth D4 of the NDD 152 and the depth D1 of the isolation structure 142, and the depth D8 is in a range of about 0.2 um to about 0.3 um. In some embodiments, the dopant concentration of each of the N-type source/drain regions 184a, 184c and N-type pick-up region 184b may be between about $10^{20}$ and about $10^{21}$ per cubic centimeter. The dopant concentration of each of the N-type source/drain regions 184a, 184c and N-type pick-up region 184b may be greater than the dopant concentration of the NLDD 182.

Figure 4:
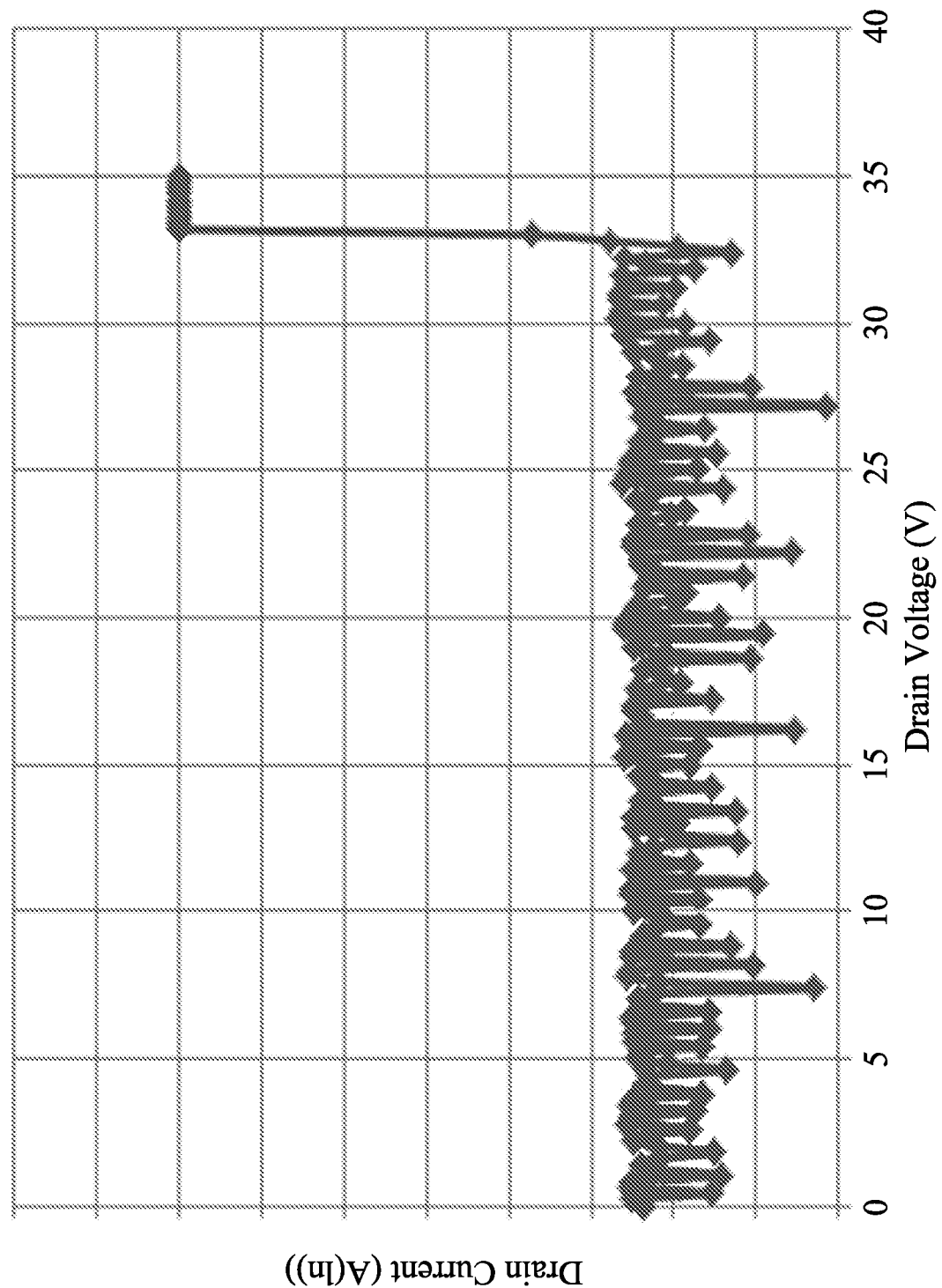
FIG. 4 is a drain voltage (Vd) vs. drain current (Id) curve of the semiconductor devices at off-state according to some embodiments of the present disclosure.
Figure 5:
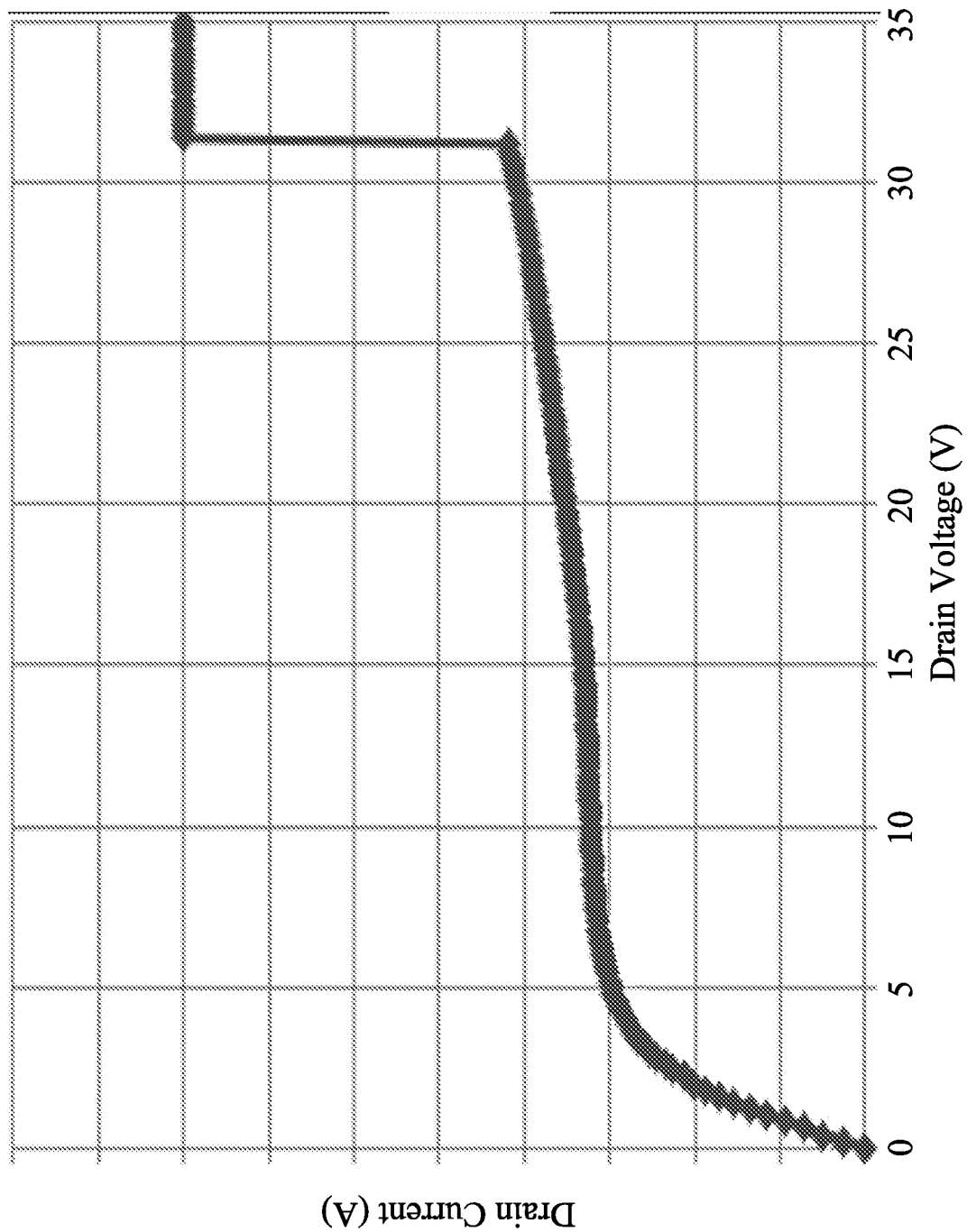
FIG. 5 is a Vd vs. Id curve of the semiconductor devices at on-state according to some embodiments of the present disclosure.

The NLDD 182, NDD 152, and N-type source/drain region 184a have the same conductivity type (i.e., N-type in this case). The NLDD 182 improves Kirk effect occurred at the surface of drain side. The Kirk effect occurs at the N/N+ junction (i.e., the interface between the NDD 152 and the N-type source/drain region 184a) due to a sharper field and an enhanced avalanche multiplication at the junction. The Kirk effect can be suppressed by implementing the NLDD 182 near the N-type source/drain region 184a. The NLDD 182 can prevent strong impact ionization near the surface 112 and modifies the electric field near the N-type source/drain region 184a, such that the electric field at the drain side is no longer strong/sharpen. Also, the NLDD 182 provides good drain voltage (Vd) vs. drain current (Id) tailing performance (as shown in FIGS. 4 and 5). Furthermore, the NLDD 182 is not formed under the N-type source/drain region 184a, and the NDD 152 surrounds the bottom portion of the NLDD 182, such that the NLDD 182 won't lower the off-state breakdown voltage of the semiconductor device.

Figure 3:
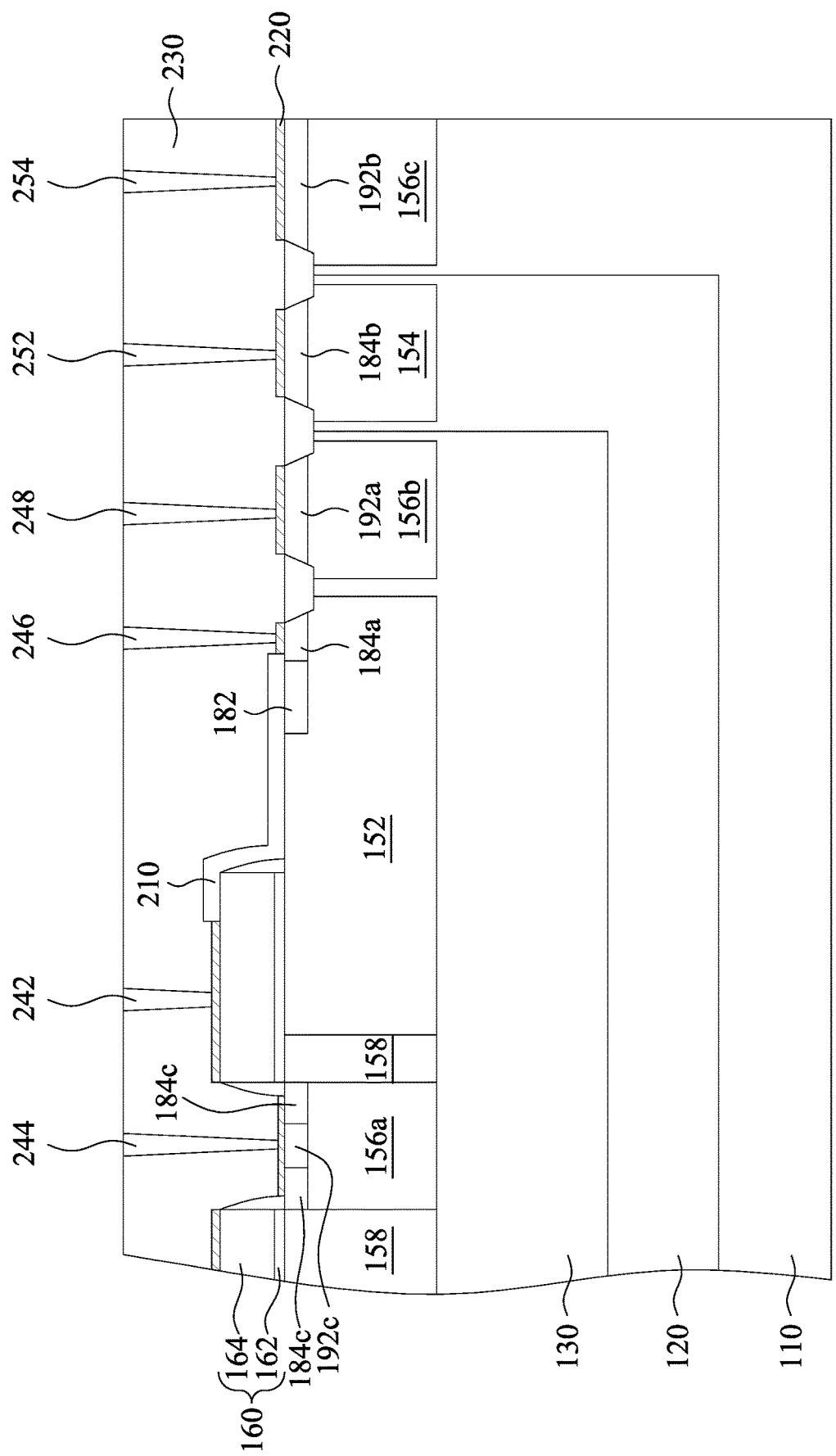
FIG. 3 is a cross-sectional view of a semiconductor device according to various embodiments.

In some embodiments, the NLDD 182 is spaced apart from the N-type source/drain region 184a as shown in FIG. 1J. A distance d1 between the NLDD 182 and N-type source/drain region 184a may be greater than 0 and equal to or less than about 0.5 um. In some other embodiments, the NLDD 182 is in contact with the N-type source/drain region 184a as shown in FIG. 3, which is a cross-sectional view of a semiconductor device according to various embodiments. Since the drain region (the N-type source/drain region 184a) is between the NLDD 182 and the isolation structure 142, i.e., the NLDD 182 does not diffuse outside the NDD 152, the NLDD 182 does not lower the off-state breakdown voltage of the semiconductor device.

Moreover, the dopant concentration of the NLDD 182 is lower than the dopant concentration of the N-type source/ drain region 184a and higher than the dopant concentration of the NDD 152. If the dopant concentration of the NLDD 182 is equal to or higher than the N-type source/drain region 184a, the NLDD 182 will become the drain region of the semiconductor device, such that the channel length is shorten and the Kirk effect still exists. If the dopant concentration of the NLDD 182 is equal to or lower than the dopant concentration of the NDD 152, the NLDD 182 does not suppress the Kirk effect.

Reference is made to FIG. 1K. P-type pick-up regions 192a-192c are formed in the SHPs 156a-156c. The P-type pick-up regions 192a-192c are P+ or heavily doped regions. In some embodiments, the P-type pick-up regions 192a-192c include p-type dopants such as boron or boron difluoride ($BF_2$). The P-type pick-up regions 192a-192c may be formed by a method such as ion implantation or diffusion. A rapid thermal annealing (RTA) process may be used to activate the implanted dopant. A depth D9 of the P-type pick-up region 192a-192c is less than the depth D4 of the NDD 152 and the depth D1 of the isolation structure 142, and the depth D9 is in a range of about 0.2 um to about 0.3 um. In some embodiments, the dopant concentration of each of the P-type pick-up region 192a-192c may be between about $10^{20}$ and about $10^{21}$ per cubic centimeter. The dopant concentration of each of the P-type pick-up region 192a-192c may be greater than the dopant concentration of the SHPs 156a-156c and the dopant concentration of the NLDD 182.

The P-type pick-up region 192a is formed in the SHP 156b and between the isolation structures 142 and 144, the P-type pick-up region 192b is formed in the SHP 156c and adjacent the isolation structure 146, and the P-type pick-up region 192c is formed in the SHP 156a and between the N-type source/drain regions 184c. The P-type pick-up region 192c is spaced apart from the HVPB 158. In some embodiments, the P-type pick-up regions 192a-192c may be formed before the formation of the N-type source/drain regions 184a, 184c and N-type pick-up region 184b and/or the NLDD 182.

It should be noted that the doping technique used in the previous example is selected purely for demonstration purposes and is not intended to limit the various embodiments to any particular doping technique. One skilled in the art will recognize that alternate embodiment could be employed (such as employing the diffusion technique).

Reference is made to FIG. 1L. A resist protective (RP) layer 210' is formed over the structure in FIG. 1K, i.e., the gate structure 160, the sidewall spacers 170, the N-type source/drain regions 184a, 184c and N-type pick-up region 184b, the NLDD 182, the P-type pick-up regions 192a-192c, and the isolation structures 142, 144, and 146. In some embodiments, the RP layer 210' is formed of a dielectric layer such as silicon dioxide using chemical vapor deposition (CVD), physical vapor deposition (PVD), atomic layer deposition (ALD), other suitable processes, or combinations thereof.

Reference is made to FIG. 1M. the RP layer 210' (see FIG. 1L) is partially etched away, leaving the RP layer 210 over at least a portion of the gate structure 160 and the sidewall spacers 170, extending over a portion of the N-type source/drain region 184a. That is, the RP layer 210 covers and in contact with the NLDD 182. The RP layer 210 may function as a silicide blocking layer during a subsequent self-aligned silicide (salicide) process discussed below. The device area that does not use the silicide process is covered with the RP layer 210. The RP layer 210 can be defined by applying, for example, an oxide wet etch that partially removes the RP layer 210'. This protects the areas under the RP layer 210 from the silicide formation.

Reference is made to FIG. 1N. Metal alloy layers 220 may be formed by silicidation, such as salicide, in which a metal material is formed next to a Si structure, then the temperature is raised to anneal and cause a reaction between underlying silicon and the metal so as to form silicide, and the un-reacted metal is etched away. The salicide material may be self-aligned to be formed on various features such as the N-type source/drain regions 184a, 184c and N-type pick-up region 184b, the P-type pick-up regions 192a-192c, and/or the gate electrode 164 to reduce contact resistance. Further, one of the metal alloy layers 220 is in contact with the N-type source/drain region 184a and an edge of the RP layer 210.

Figure 2:
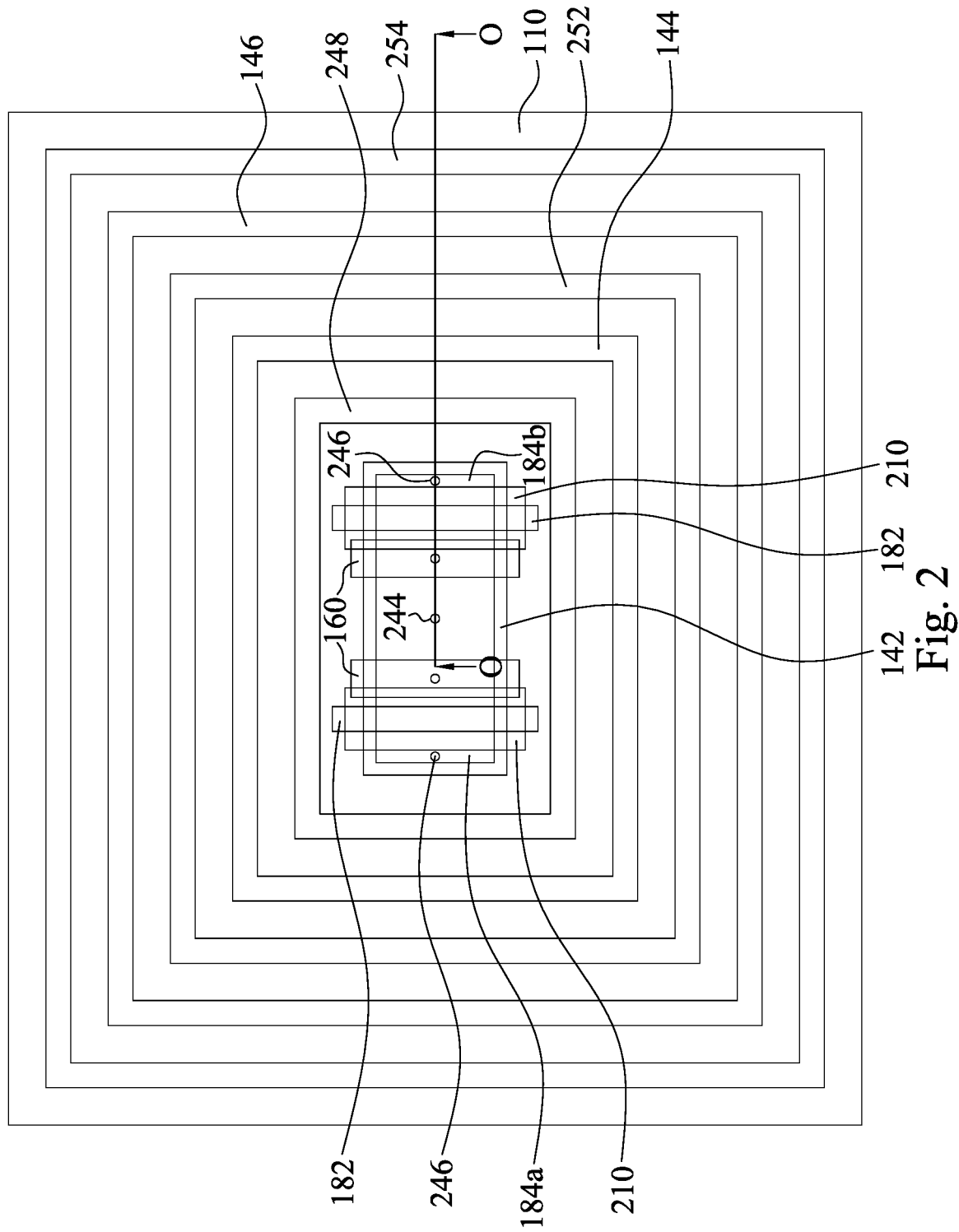
FIG. 2 is a top view of the semiconductor device of FIG. 1O in various embodiments.

Reference is made to FIGS. 1O and 2, where FIG. 2 is a top view of the semiconductor device of FIG. 1O in various embodiments. The cross-sectional view shown in FIG. 1O is taken along line O-O in FIG. 2. For clarity, the metal alloy layers 220 and the wells are omitted in FIG. 2. An interlayer dielectric (ILD) 230 is formed above the structure in FIG. 1N. The ILD 230 may include silicon oxide. Alternatively or additionally, the ILD 230 includes a material having a low dielectric constant such as a dielectric constant less than about 3.5. In some embodiments, the dielectric layer 230 includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer 230 may be formed by a technique including spin-on coating, CVD, or other suitable processes.

Then, a plurality of contacts 242, 244, 246, 248, 252, and 254 are formed in the ILD 230. For example, a plurality of the openings are formed in the ILD 230, and conductive materials are filled in the openings. The excess portions of the conductive materials are removed to form the contacts 242, 244, 246, 248, 252, and 254. The contacts 242, 244, 246, 248, 252, and 254 may be made of tungsten, aluminum, copper, or other suitable materials. In some embodiments, the contact 242 is connected to the gate structure 160, the contact 244 is connected to the P-type pick-up region 192c and the N-type source/drain regions 184c (i.e., the source region of the semiconductor device), the contact 246 is connected to the N-type source/drain regions 184a (i.e., the drain region of the semiconductor device), the contact 248 is connected to the P-type pick-up regions 192a, the contact 252 is connected to the N-type pick-up region 184b, and the contact 254 is connected to the P-type pick-up region 192b.

The semiconductor device includes the gate structure 160, the drain region (i.e., the N-type source/drain region 184a), the source region (i.e., the N-type source/drain region 184c), the NDD 152, and the NLDD 182. The source region and the drain region are on opposite sides of the gate structure 160 and on opposite sides of the NLDD 182. The NDD 152 is under the gate structure 160. The NLDD 182 and the drain region are both in the NDD 152. The depth D7 of the NLDD 182 is less than the depth D4 of the NDD 152, and the depth D7 is in a range of about 0.2 um to about 0.4 um. In some embodiments, the width W of the NLDD 182 is greater than 0 um and equal to or less than about 1 um. If the width W of the NLDD 182 is greater than about 1 um, the NLDD 182 may be close to the gate structure 160, such that the off-state breakdown voltage of the semiconductor device may be decreased. In some embodiments, the NLDD 182 does not overlap with the gate structure 160. That is, the gate structure 160 does not cover the NLDD 182, and the gate structure 160 is spaced apart from a sidewall 182s of the NLDD 182.

The NLDD 182 is formed in the NDD 152 and between the N-type source/drain region 184a and the gate structure 160. The NLDD 182, NDD 152, and N-type source/drain region 184a have substantially coplanar top surfaces (i.e., the top surface 112 of the substrate 110). In some embodiments, a bottom surface of 182b of the NLDD 182 is laterally spaced apart from a bottom surface 184ab of the N-type source/drain region 184a to define a distance d1. The distance d1 between the NLDD 182 and N-type source/drain region 184a may be greater than 0 and equal to or less than about 0.5 um. If the distance d1 is greater than about 0.5 um, the NLDD 182 is close to the gate structure 160, and the off-state breakdown voltage of the semiconductor device may be decreased. Since the drain region (the N-type source/drain region 184a) is between the NLDD 182 and the isolation structure 142, i.e., the NLDD 182 does not diffuse outside the NDD 152, the NLDD 182 does not lower the off-state breakdown voltage of the semiconductor device.

In some embodiments, a distance d2, referred to as a drift region length, is formed between the N-type source/drain region 184a and an edge of the NDD 152 adjacent the HVPB 158. A sum of the width W and the distance d1 is about 10% to about 50% of the distance d2. If the sum (W+d1) is lower than about 10%, the NLDD 182 is too short to effectively suppress the Kirk effect; if the sum (W+d1) is greater than about 50%, the NLDD 182 may be close to the gate structure 160, resulting in a low off-state breakdown voltage.

The semiconductor device further includes an RP layer 210 above the gate structure 160 and the drift region 152. The RP layer 210 extends over a portion of the gate structure 160 and over the drain region. The RP layer 210 is in contact with the NLDD 182. Reference is made to FIGS. 1O and 2. The substrate device further includes the SHN 154, the SHPs 156a-156c, the HVPBs 158, and isolation structures 142, 144, and 146. The isolation structures 142, 144, and 146, the SHN 154 and the SHPs 156a-156c are ring-shaped. The SHP 156c surrounds the isolation structure 146, the isolation structure 146 surrounds the SHN 154, the SHN 154 surrounds the isolation structure 144, the isolation structure 144 surrounds the SHP 156b, SHP 156b surrounds the isolation structure 142, and the isolation structure 142 surrounds the NDD 152, the SHP 156a, the HVPBs 158, and the structures formed thereon. The drain region is in contact with the isolation structure 142, and the NLDD 182 is spaced apart from the isolation structure 142. In some embodiments, the depths of the NLDD 182 and the drain region are both less than the depth of the isolation structure 142. That is, the bottom surface 182b of the NLDD 182 is above the bottom surface 142b of the isolation structure 142.

Since the NLDD 182 is formed between the gate structure 160 and the N-type source/drain regions 184a, the Kirk effect occurred at the drain side can be suppressed. Furthermore, the NLDD 182 also provides good Vd vs. Id tailing performance. Moreover, the NLDD 182 does not complicate the manufacturing process for forming the semiconductor device.

FIG. 3 is a cross-sectional view of a semiconductor device according to various embodiments. The difference between the semiconductor devices in FIGS. 3 and 1O pertains to the position of the NLDD 182. In FIG. 3, the NLDD 182 is in contact with the N-type source/drain regions 184a. That is, the distance d1 (see FIG. 1J) is 0. Other relevant structural details of the semiconductor device in FIG. 3 are similar to the semiconductor device in FIG. 1O, and, therefore, a description in this regard will not be repeated hereinafter.

FIG. 4 is a drain voltage (Vd) vs. drain current (Id) curve of the semiconductor devices at off-state according to some embodiments of the present disclosure, and FIG. 5 is a Vd vs. Id curve of the semiconductor devices at on-state according to some embodiments of the present disclosure. In FIG. 4, the breakdown voltage at off-state (BVoff) is about 33 V. In FIG. 5, the breakdown voltage at on-state (BVon) is about 32 V. Further, FIG. 5 shows a good Id-Vd tailing performance.

Figure 6A:
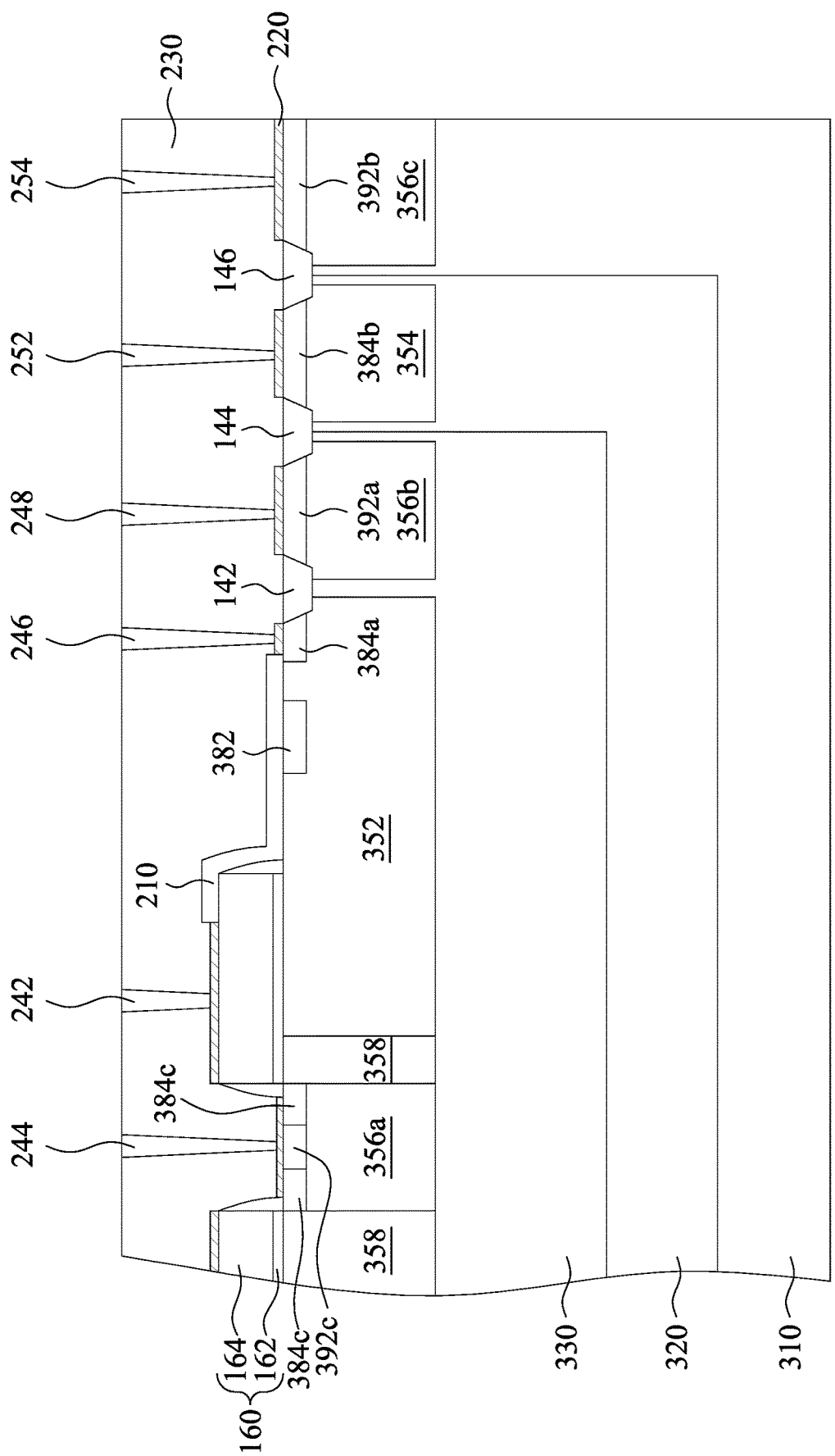
FIGS. 6A and 6B are cross-sectional views of semiconductor devices according to various embodiments.
Figure 6B:
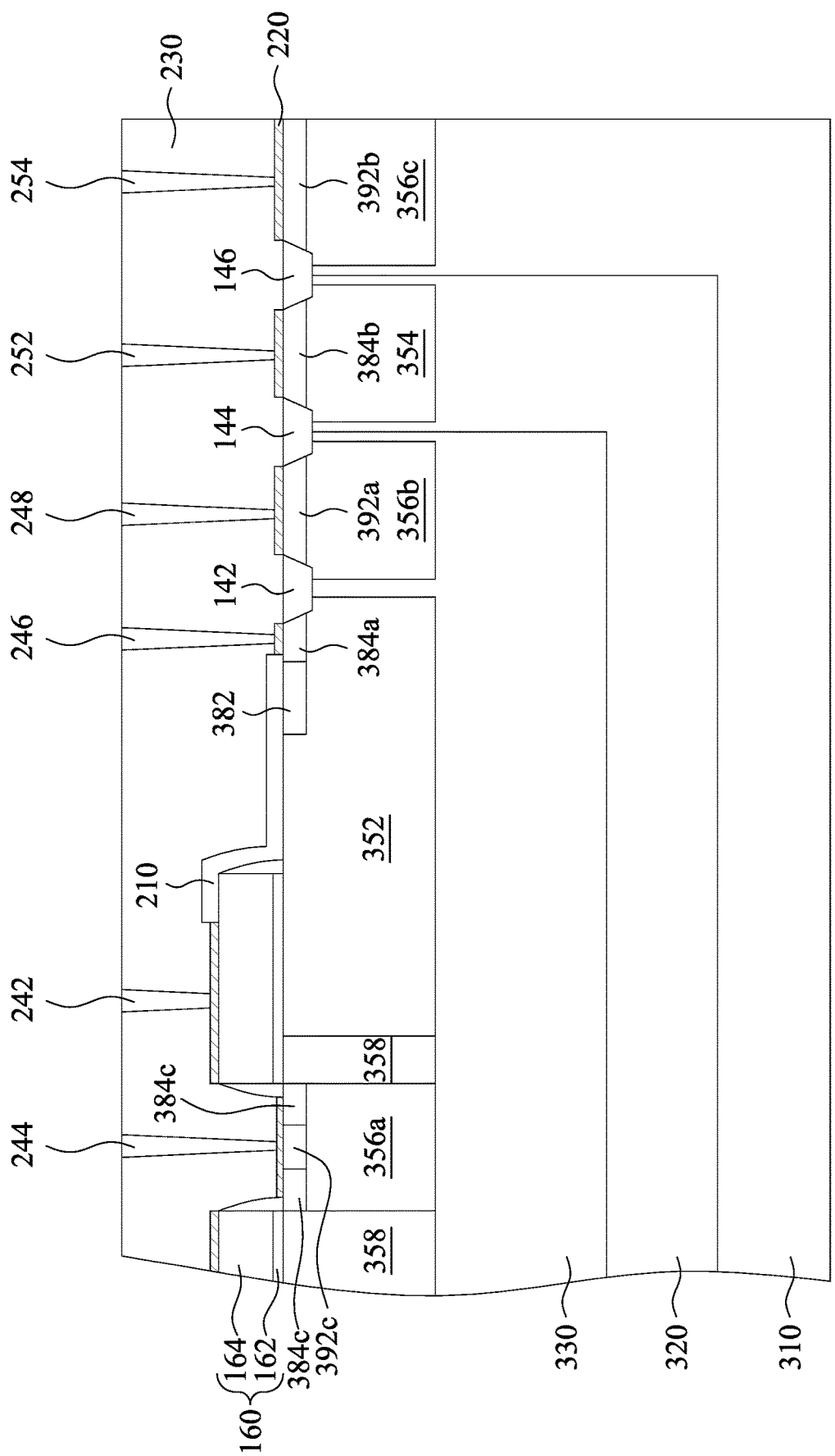

FIGS. 6A and 6B are cross-sectional views of semiconductor devices according to various embodiments. The difference between the semiconductor devices in FIGS. 6A and 1O pertains to the conductivity types of the wells. Specifically, in FIGS. 6A and 6B, the semiconductor device includes a semiconductor substrate 310, a DPW 320, and a DNW 330. The semiconductor substrate 310 is an n-substrate. In some embodiments, the semiconductor device further includes a gate structure 160, isolation structures 142, 144, and 146, a PDD 352, a SHP 354, SHNs 356a, 356b, and 356c, and HVNBs 358. In some embodiments, the semiconductor device further includes a PLDD 382, P-type source/drain regions 384a and 384c, P-type pick-up region 384b, and N-type pick-up regions 392a, 392b, 392c. The semiconductor device further includes an RP layer 210, metal alloy layers 220, an ILD 230, and contacts 242, 244, 246, 248, 252, and 254. In some embodiments, the PLDD 382 is spaced apart from the P-type source/drain regions 384a as shown in FIG. 6A. In some other embodiments, the PLDD 382 is in contact with the P-type source/drain regions 384a as shown in FIG. 6B. Other relevant structural details of the semiconductor device in FIGS. 6A and 6B are similar to the semiconductor device in FIG. 1O, and, therefore, a description in this regard will not be repeated hereinafter.

Figure 7A:
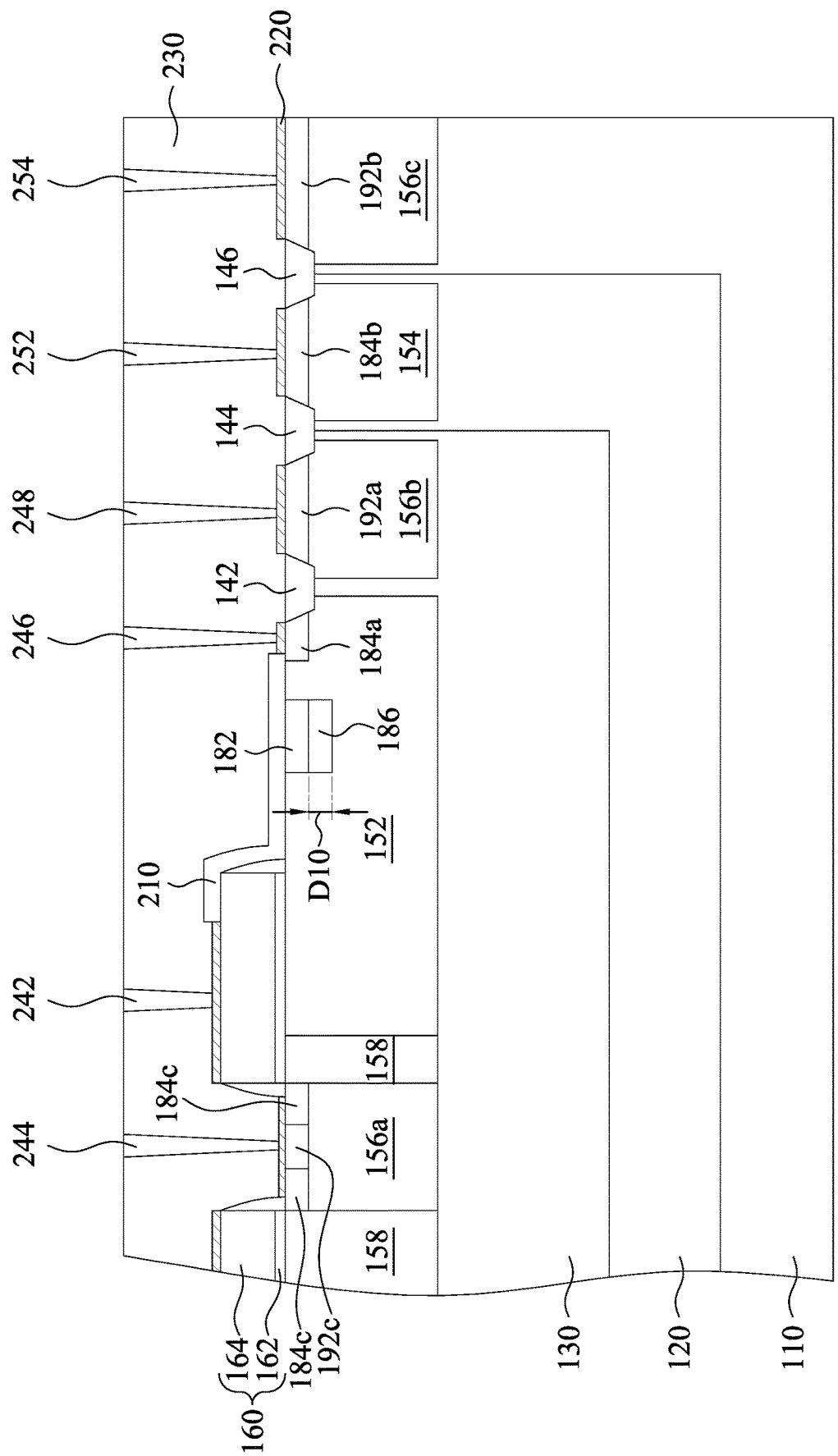
FIGS. 7A and 7B are cross-sectional views of semiconductor devices according to various embodiments.
Figure 7B:
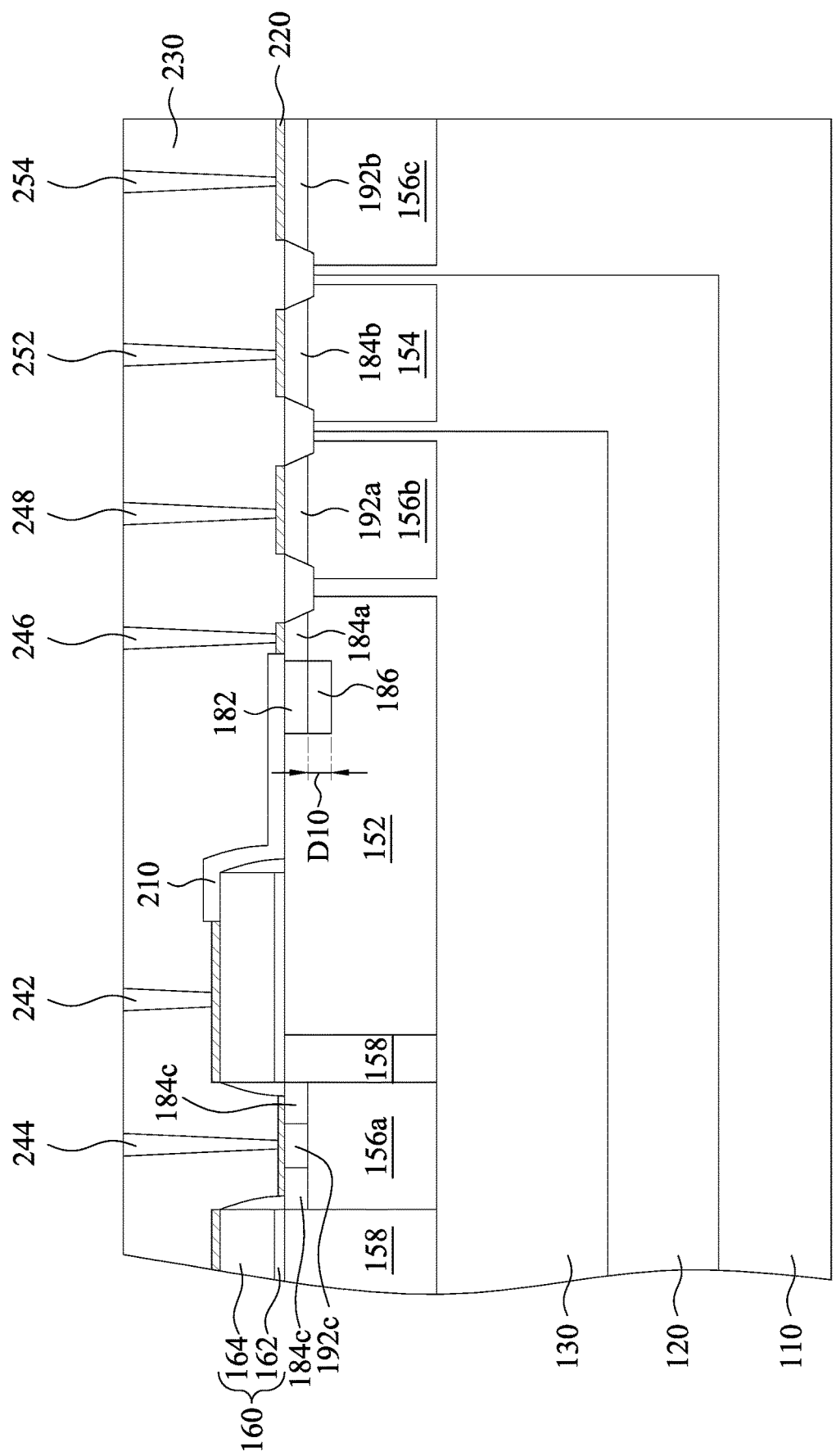

FIGS. 7A and 7B are cross-sectional views of semiconductor devices according to various embodiments. The difference between the semiconductor devices in FIGS. 7A and 1O pertains to the presence of a pocket (doped) region. In FIGS. 7A and 7B, a P-type pocket region 186 is formed under the NLDD 182. That is, the P-type pocket region 186 and the NLDD 182 have different conductivity types. The P-type pocket region 186 is configured for isolating the NLDD 182. In some embodiments, the P-type pocket region 186 may be formed in the process shown in FIG. 1H and before the formation of the NLDD 182. The P-type pocket region 186 and the NLDD 182 may have substantially the same width. In some embodiments, the P-type pocket region 186 has a depth D10 in a range of about 0.4 um to about 0.6 um, and the dopant concentration of the P-type pocket region 186 is between about $10^{17}$ and about $10^{19}$ per cubic centimeter. In some embodiments, the P-type pocket region 186 and the NLDD 182 have substantially the same or similar dopant concentration. Other relevant structural details of the semiconductor device in FIGS. 7A and 7B are similar to the semiconductor device in FIG. 1O, and, therefore, a description in this regard will not be repeated hereinafter. In some other embodiments, an N-type pocket region may be formed under the PLDD 382 in FIGS. 6A and/or 6B, and the detailed description will not be repeated hereinafter.

Figure 8:
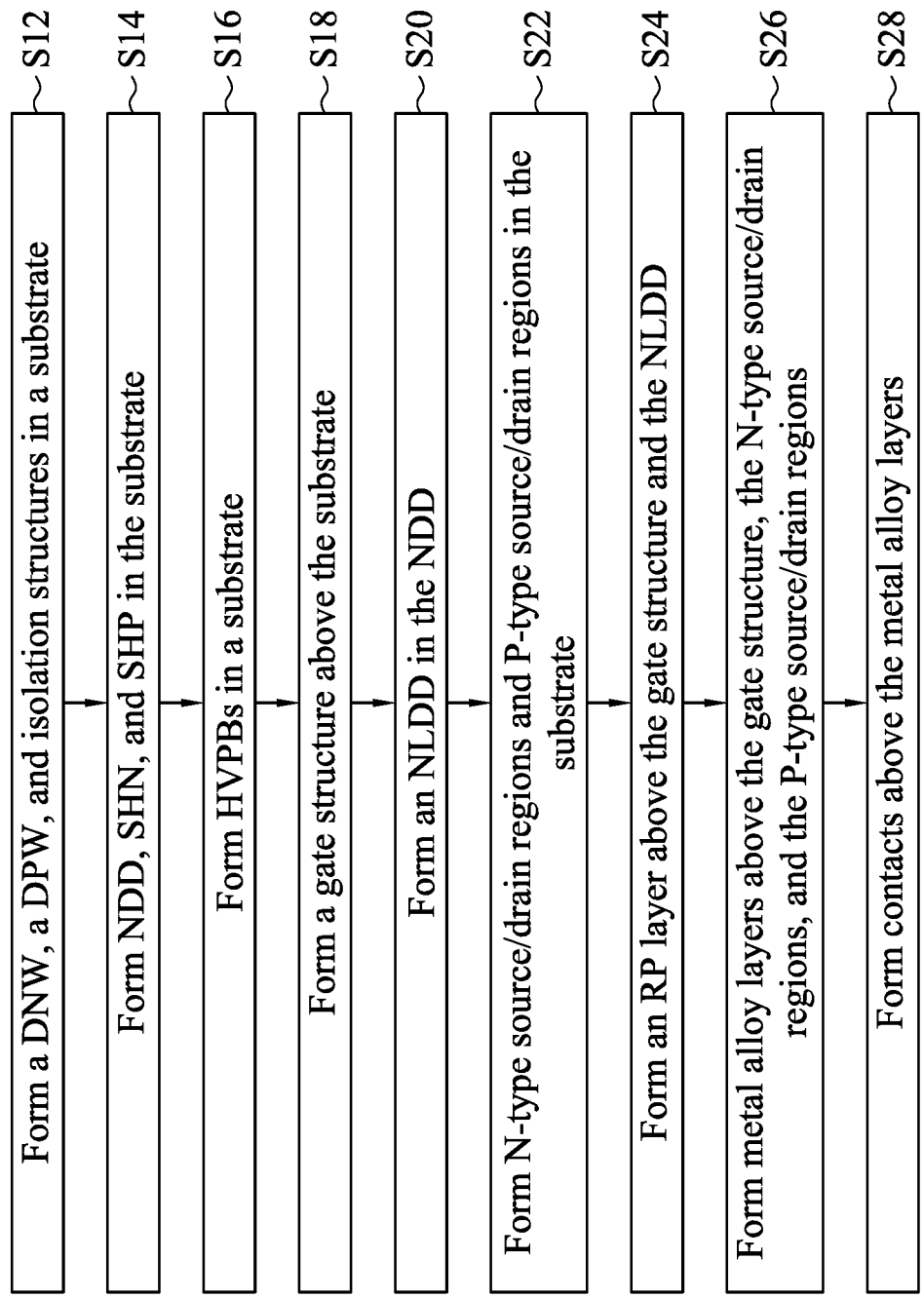
FIG. 8 is a flow chart of a method for forming a semiconductor device in accordance with some embodiments of the present disclosure.

FIG. 8 is a flow chart of a method M1 for forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, DNW, DPW, and isolation structures are formed in a substrate. FIGS. 1A-1C illustrate perspective views and cross-sectional views of some embodiments corresponding to act in block S12. At block S14, NDD, SHN, and SHP are formed in the substrate. FIG. 1D illustrates perspective views and cross-sectional views of some embodiments corresponding to act in block S14. At block S16, HVPBs are formed in a substrate. FIGS. 1E-1F illustrate perspective views and cross-sectional views of some embodiments corresponding to act in block S16. At block S18, a gate structure is formed above the substrate. FIG. 1G illustrates perspective views and cross-sectional views of some embodiments corresponding to act in block S18. At block S20, an NLDD is formed in the NDD. FIG. 1H illustrates perspective views and cross-sectional views of some embodiments corresponding to act in block S20. At block S22, N-type source/drain regions and P-type source/drain regions are formed in the substrate. FIGS. 1J-1K illustrate perspective views and cross-sectional views of some embodiments corresponding to act in block S22. At block S24, an RP layer is formed above the gate structure and the NLDD. FIGS. 1L-1M illustrate perspective views and cross-sectional views of some embodiments corresponding to act in block S24. At block S26, metal alloy layers are respectively formed above the gate structure, the N-type source/drain regions, and the P-type source/drain regions. FIG. 1N illustrate perspective views and cross-sectional views of some embodiments corresponding to act in block S26. At block S28, contacts are respectively formed above the metal alloy layers. FIG. 1O illustrate perspective views and cross-sectional views of some embodiments corresponding to act in block S28. In some embodiments, a process that forming a pocket region in the NDD is performed between the blocks S18 and S20.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the NLDD improves the Kirk effect occurring at the drain side. As such, the off-state breakdown voltage, the on-state breakdown voltage, and the Id-Vd tailing performances are improved. Another advantage is that the NLDD does not complicate the manufacturing process for forming the semiconductor device.

According to some embodiments, a semiconductor device includes a substrate, a gate structure, a drift region, a source region, a drain region, and a doped region. The gate structure is above the substrate. The drift region is in the substrate and under the gate structure. The source region and the drain region are on opposite sides of the gate structure. The drain region is in the drift region, and the source region is outside the drift region. The doped region is in the drift region and between the drain region and the gate structure. The doped region is spaced apart from a bottom surface of the drain region.

According to some embodiments, a semiconductor device includes a substrate, a drift region, a gate structure, a source region, a drain region, an isolation structure, and a doped region. The drift region is in the substrate. The gate structure is above the drift region. The source region and the drain region are on opposite sides of the gate structure. The drain region is in the drift region. The isolation structure is in contact with the drain region and the drift region. The doped region is in the drift region and between the drain region and the gate structure. The doped region and the drain region have the same conductivity type, and a bottom surface of the doped region is above a bottom surface of the isolation structure.

According to some embodiments, a method for manufacturing a semiconductor device includes forming a drift region in a substrate. A gate structure is formed above the drift region. A doped region is formed in the drift region. A source region and a drain region are formed on opposite sides of the gate structure and in the drift region. The doped region is formed between the gate structure and the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same puRPses and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
a gate structure above the substrate;
a drift region in the substrate and under the gate structure;
a source region and a drain region on opposite sides of the gate structure, wherein the drain region is in the drift region, and the source region is outside the drift region;
a doped region in the drift region and between the drain region and the gate structure, wherein an entirety of the doped region is laterally separated from the drain region by a non-zero distance;
a pocket region below the doped region, the pocket region comprising substantially a same width as the doped region and a different conductivity type than the doped region, wherein a bottom end of the pocket region is higher than a bottom end of the drift region; and
a protection layer in contact with a top surface of the drain region and a top surface of the doped region, and terminating at a top surface of the gate structure.

2. The semiconductor device of claim 1, wherein the drift region, the doped region, and the drain region have the same conductivity type.

3. The semiconductor device of claim 1, wherein a doping concentration of the doped region is lower than a doping concentration of the drain region.

4. The semiconductor device of claim 1, wherein a doping concentration of the doped region is higher than a doping concentration of the drift region.

5. The semiconductor device of claim 1, wherein a depth of the doped region is less than a depth of the drift region.

6. The semiconductor device of claim 1, wherein an entirety of the gate structure is spaced apart from a sidewall of the doped region facing the source region.

7. The semiconductor device of claim 1, further comprising an interlayer dielectric layer laterally surrounding the gate structure and covering the protection layer.

8. The semiconductor device of claim 1, wherein a portion of the top surface of the gate structure is uncovered by the protection layer.

9. A semiconductor device comprising:
   a substrate;
   a drift region in the substrate;
   a gate structure above the drift region;
   a source region and a drain region on opposite sides of the gate structure, wherein the drain region is in the drift region;
   an isolation structure in contact with the drain region and the drift region;
   a doped region in the drift region and between the drain region and the gate structure, wherein the doped region and the drain region have the same conductivity type, and wherein an entirety of the doped region non-overlaps the gate structure;
   a pocket region directly below the doped region, the pocket region comprising substantially a same width as the doped region and a different conductivity type than the doped region; and
   a protection layer in contact with a top surface of the drain region and a top surface of the doped region, and terminating at a top surface of the gate structure.

10. The semiconductor device of claim 9, wherein a doping concentration of the doped region is between a doping concentration of the drain region and a doping concentration of the drift region.

11. The semiconductor device of claim 9, wherein the protection layer terminates prior to reaching the source region.

12. The semiconductor device of claim 9, wherein a bottom surface of the doped region is above a bottom surface of the isolation structure.

13. The semiconductor device of claim 9, further comprising an interlayer dielectric layer laterally surrounding the gate structure and covering the protection layer.

14. The semiconductor device of claim 9, wherein a bottom end of the pocket region is higher than a bottom end of the drift region.

15. A method for manufacturing a semiconductor device comprising:
   forming a drift region in a substrate;
   forming a gate structure above the drift region;
   forming a pocket region in the drift region after forming the gate structure;
   forming a doped region in the drift region and over the pocket region, wherein the doped region and the pocket region have different conductivity types;
   forming a source region and a drain region on opposite sides of the gate structure and in the drift region, wherein the doped region is formed between the gate structure and the drain region;
   forming a protection layer extending from a top surface of the gate structure to a top surface of the doped region; and
   forming an interlayer dielectric layer laterally surrounding the gate structure and covering the protection layer.

16. The method of claim 15, wherein the doped region and the drain region have the same conductivity type.

17. The method of claim 15, wherein a doping concentration of the doped region is between a doping concentration of the drain region and a doping concentration of the drift region.

18. The method of claim 15, further comprising forming a dielectric layer above the gate structure and the doped region.

19. The method of claim 15, further comprising forming a gate spacer on a sidewall of the gate structure after forming the doped region.

20. The method of claim 19, wherein the source region and the drain regions are formed after forming the gate spacer.

* * * * *